United States Patent
Kanno et al.

(10) Patent No.: US 9,318,658 B2
(45) Date of Patent: Apr. 19, 2016

(54) METHOD FOR MANUFACTURING RED PHOSPHOR

(75) Inventors: Masaki Kanno, Tochigi (JP); Takamasa Izawa, Tochigi (JP); Tsuneo Kusunoki, Tochigi (JP)

(73) Assignee: DEXERIALS CORPORATION, Tokyo (JP)

(*) Notice: Subject to any disclaimer, the term of this patent is extended or adjusted under 35 U.S.C. 154(b) by 63 days.

(21) Appl. No.: 14/110,853

(22) PCT Filed: May 14, 2012

(86) PCT No.: PCT/JP2012/062291
§ 371 (c)(1),
(2), (4) Date: Oct. 9, 2013

(87) PCT Pub. No.: WO2012/157604
PCT Pub. Date: Nov. 22, 2012

(65) Prior Publication Data
US 2014/0036201 A1    Feb. 6, 2014

(30) Foreign Application Priority Data

May 14, 2011  (JP) .................... 2011-108870
Dec. 1, 2011  (JP) .................... 2011-263327

(51) Int. Cl.
*C09K 11/64* (2006.01)
*C09K 11/08* (2006.01)
(Continued)

(52) U.S. Cl.
CPC ............ *H01L 33/26* (2013.01); *C09K 11/0883* (2013.01); *C09K 11/7731* (2013.01);
(Continued)

(58) Field of Classification Search
CPC ........... C09K 11/0883; C09K 11/7734; H01L 33/504; G02F 1/133614
See application file for complete search history.

(56) References Cited

U.S. PATENT DOCUMENTS 8,691,113 B2 *  4/2014  Akiho et al. ............ 252/301.4 F
8,808,578 B2 *  8/2014  Izawa et al. ............ 252/301.4 F
(Continued)

FOREIGN PATENT DOCUMENTS

JP    A-2008-120946    5/2008
JP    A-2011-001530    1/2011
(Continued)

OTHER PUBLICATIONS

International Search Report issued in International Application No. PCT/JP2012/062291 dated Jun. 5, 2012.
(Continued)

*Primary Examiner* — Carol M Koslow
(74) *Attorney, Agent, or Firm* — Oliff PLC

(57) ABSTRACT

Provided is a process for producing a red phosphor, said process achieving enhanced productivity. Also provided are: a red phosphor having excellent luminescence characteristics; and a white light source, a lighting system, and a liquid crystal display device, using the red phosphor. This process comprises: mixing an A-containing compound, a nitrogen-free europium source, a silicon-containing compound, an aluminum-containing compound and a carbon-containing reducing agent so as to form a mixture wherein the atomic ratio among A, europium (Eu), silicon (Si), aluminum (Al) and carbon (C) is a value represented by compositional formula (1); firing the mixture; and pulverizing the fired mixture. $(A_{m-x}Eu_x)Al_y(Si_{1-z}C_z)90 \cdot nN[12+y-2(n-m)/3]$ (1) [wherein A is at least one element selected from among magnesium (Mg), calcium (Ca), strontium (Sr) and barium (Ba), and m, x, z and n satisfy the relationships: 3.

7 Claims, 33 Drawing Sheets

(51) Int. Cl.
*H01L 33/26* (2010.01)
*C09K 11/77* (2006.01)
*G02F 1/1335* (2006.01)
*H01L 23/00* (2006.01)
*F21V 9/08* (2006.01)
*G02F 1/13357* (2006.01)
*H01L 33/50* (2010.01)

(52) U.S. Cl.
CPC .......... *C09K11/7734* (2013.01); *G02F 1/1336* (2013.01); *H01L 24/97* (2013.01); *H01L 33/504* (2013.01); *H01L 2224/48091* (2013.01); *H01L 2924/12041* (2013.01); *Y02B 20/181* (2013.01)

(56) References Cited

U.S. PATENT DOCUMENTS

| | | | | |
|---|---|---|---|---|
| 8,884,513 | B2* | 11/2014 | Izawa et al. | 313/503 |
| 8,961,827 | B2* | 2/2015 | Izawa et al. | 252/301.4 F |
| 2006/0220047 | A1 | 10/2006 | Nagatomi et al. | |
| 2006/0220520 | A1 | 10/2006 | Sakane et al. | |
| 2009/0026915 | A1 | 1/2009 | Nagatomi et al. | |
| 2010/0288972 | A1 | 11/2010 | Roesler et al. | |
| 2011/0001154 | A1 | 1/2011 | Kim et al. | |

FOREIGN PATENT DOCUMENTS

| | | | |
|---|---|---|---|
| WO | WO 2006/106883 | A1 | 10/2006 |
| WO | WO 2010/002015 | * | 1/2010 |

OTHER PUBLICATIONS

Aug. 17, 2015 Office Action issued in Chinese Patent Application No. 201280023261.4.
Oct. 17, 2014 Office Action issued in Chinese Patent Application No. 201280023261.4.
Aug. 20, 2015 European Search Report issued in European Patent Application No. 12 785 348.9.
Sep. 24, 2014 European Search Opinion issued in European Patent Application No. 12 785 348.9.
Nov. 19, 2013 International Preliminary Report on Patentability issued in Application No. PCT/JP2012/062291.

* cited by examiner

METHOD FOR MANUFACTURING RED PHOSPHOR

TECHNICAL FIELD

This invention relates to a method for manufacturing a red phosphor having an emission peak wavelength in a red wavelength range (for example, a wavelength between 620 nm and 770 nm). This application claims priorities to Japanese Patent Application No. 2011-108870, filed on May 14, 2011 and to Japanese Patent Application No. 2011-263327, filed on Dec. 1, 2011, the entire contents of which are incorporated herein by reference.

BACKGROUND ART

Recently, in the field of application of high color gamut back lights and Light Emitting Diodes (LEDs) having high color rendering properties, there have been increasing demand for red phosphors that emits red light with blue LED excitation. Accordingly, nitride red phosphors having chemical stabilities and high efficiencies have been developed.

For example, PLT 1 discloses a manufacturing of a red phosphor containing europium (Eu), silicon (Si), oxygen (O) and nitrogen (N) by using a europium nitride (EuN) as a source of europium (Eu).

CITATION LIST

Patent Literature

PLT 1: Japanese Unexamined Patent Application Publication No. 2011-1530

SUMMARY OF INVENTION

Technical Problem

However, the technology of PLT 1, which mixes raw materials by a dry mixing (milling and mixing by using a mortar) to produce a mixture, tends to cause composition nonuniformity in the mixture, making it difficult to improve productivity.

Having regard to the above, an object of the present invention is to provide a method for manufacturing a red phosphor capable of improving productivity.

Another object of the present invention is to provide a red phosphor with an excellent light-emitting property, as well as a white light source, an illumination apparatus and a liquid crystal display device using this red phosphor.

Solution to Problem

To solve the above-described problem, a method for manufacturing a red phosphor according to the present invention comprises steps of: mixing an element A-containing compound, a nitrogen-free europium, a silicon-containing compound, an aluminum-containing compound and a carbon-containing reducing agent so as to form a mixture, the atomic ratio among element A, europium (Eu), silicon (Si), aluminum (Al) and carbon (C) being a value represented by composition formula (1); firing the mixture; and milling the fired mixture.

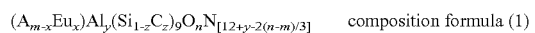
composition formula (1)

wherein the element A is at least one element selected from the group of magnesium (Mg), calcium (Ca), strontium (Sr) and barium (Ba), and m, x, z and n satisfy the relation: $3<m<5$, $0<x<1$, $0\leq y\leq 2$, $0<z<1$, and $0<n<10$.

In addition, a red phosphor according to the present invention is obtained by mixing an element (A), a nitrogen-free europium, a silicon-containing compound, an aluminum-containing compound and a carbon-containing reducing agent so as to form a mixture, the atomic ratio among element (A), europium (Eu), silicon (Si), aluminum (Al) and carbon (C) being a value represented by composition formula (1); and firing the mixture; and milling the fired mixture, wherein the red phosphor has an X-ray diffraction pattern in which a peak intensity existing at a position corresponding to a diffraction angle of 36° to 36.6° is 0.65 times or more than a peak intensity existing at a position corresponding to a diffraction angle of 35° to 36°

Furthermore, the white light source according to the present invention comprises a blue light-emitting diode formed on a device substrate, and a kneaded material provided on the blue light-emitting diode and formed by kneading a transparent resin with a red phosphor and a green or yellow phosphor, wherein the red phosphor is obtained by mixing an element (A), a nitrogen-free europium, a silicon-containing compound, an aluminum-containing compound and a carbon-containing reducing agent so as to form a mixture, the atomic ratio among element (A), europium (Eu), silicon (Si), aluminum (Al) and carbon (C) being a value represented by composition formula (1); and firing the mixture; and milling the fired mixture, and further wherein the red phosphor has an X-ray diffraction pattern in which a peak intensity existing at a position corresponding to a diffraction angle of 36° to 36.6° is 0.65 times or more than a peak intensity existing at a position corresponding to a diffraction angle of 35° to 36°

Moreover, an illumination apparatus according to the present invention comprises a plurality of white light sources arranged on an illumination substrate, wherein the white light source comprises a blue light-emitting diode formed on a device substrate, and a kneaded material provided on the blue light-emitting diode and formed by kneading a transparent resin with a red phosphor and a green or yellow phosphor, wherein the red phosphor is obtained by mixing an element (A), a nitrogen-free europium, a silicon-containing compound, an aluminum-containing compound and a carbon-containing reducing agent so as to form a mixture, the atomic ratio among element (A), europium (Eu), silicon (Si), aluminum (Al) and carbon (C) being a value represented by composition formula (1); and firing the mixture; and milling the fired mixture, and further wherein the red phosphor has an X-ray diffraction pattern in which a peak intensity existing at a position corresponding to a diffraction angle of 36° to 36.6° is 0.65 times or more than a peak intensity existing at a position corresponding to a diffraction angle of 35° to 36°.

In addition, a liquid crystal display device according to the present invention comprises a liquid crystal display panel and a backlight using a plurality of white light sources for illuminating the liquid crystal display panel, wherein the white light source comprises a blue light-emitting diode formed on a device substrate, and a kneaded material provided on the blue light-emitting diode and formed by kneading a transparent resin with a red phosphor and a green or yellow phosphor, wherein the red phosphor is obtained by mixing an element (A), a nitrogen-free europium, a silicon-containing compound, an aluminum-containing compound and a carbon-containing reducing agent so as to form a mixture, the atomic ratio among element (A), europium (Eu), silicon (Si), aluminum (Al) and carbon (C) being a value represented by composition formula (1); and firing the mixture; and milling the fired mixture, and further wherein the red phosphor has an X-ray diffraction pattern in which a peak intensity existing at a position corresponding to a diffraction angle of 36° to 36.6° is 0.65 times or more than a peak intensity existing at a position corresponding to a diffraction angle of 35° to 36°.

Advantageous Effects of Invention

The present invention, using a nitrogen-free europium as a source of europium, allows a mixing by a wet process, thereby preventing composition nonuniformity in the mixture and improving productivity.

Furthermore, the present invention provides a crystal structure having a specific X-ray diffraction pattern, thereby achieving an excellent light-emitting property.

DESCRIPTION OF EMBODIMENTS

Figure 1:
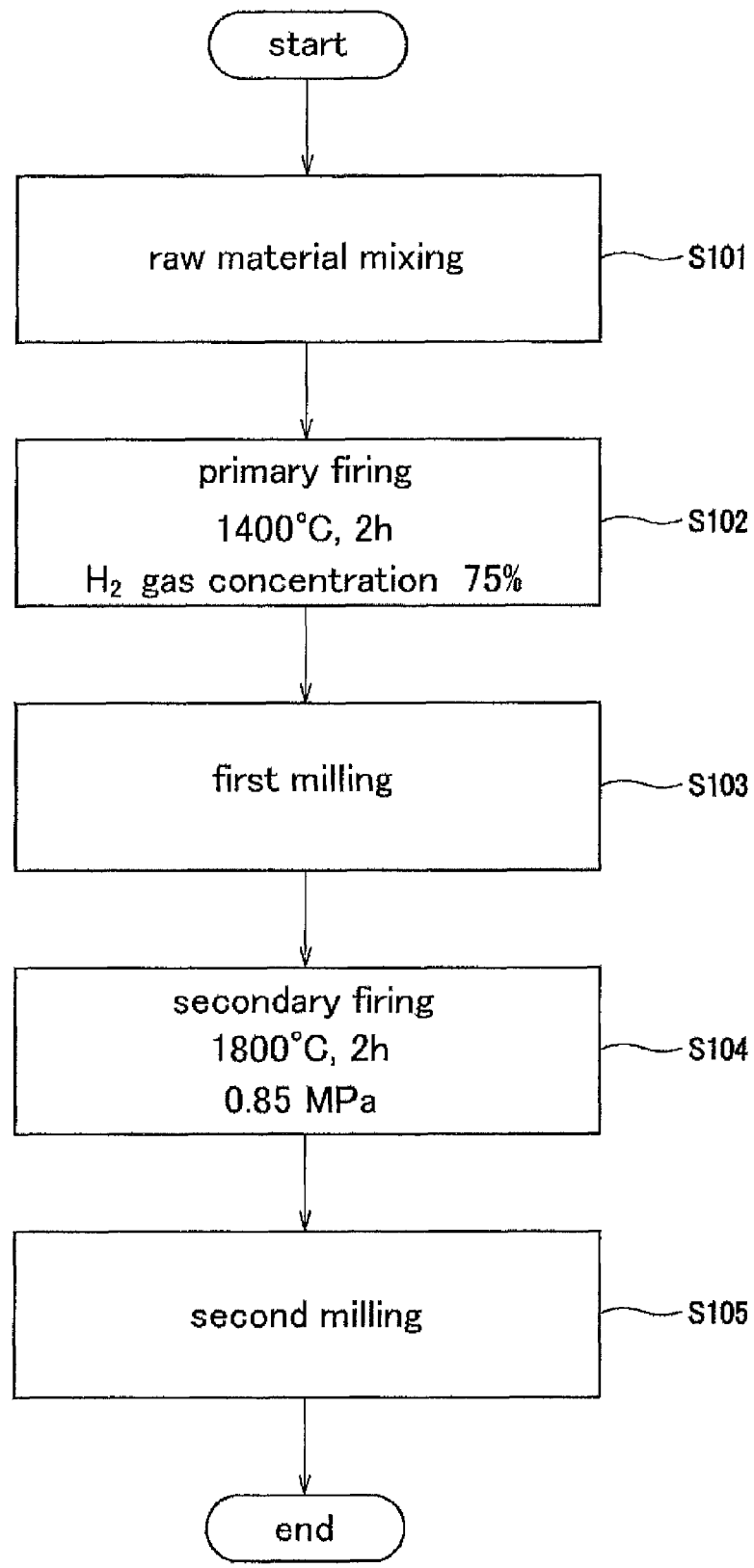
FIG. 1. is a flowchart showing a conventional method for manufacturing a red phosphor.

Embodiments of the present invention will now be described with reference to the accompanying drawings according to the following order.
1. Constitution of red phosphor
2. Conventional method for manufacturing red phosphor
3. Method for manufacturing red phosphor according to one embodiment of the present invention
4. Constitution of red phosphor with excellent light-emitting property
5. Exemplary constitution of white light source
6. Exemplary constitution of illumination apparatus
7. Exemplary constitution of liquid crystal display device
8. Examples 1. Constitution of Red Phosphor A red phosphor according to one embodiment of the present invention contains element A, europium (Eu), silicon (Si), aluminum (Al) and carbon (C) with an atomic ratio represented by the following composition formula (1):

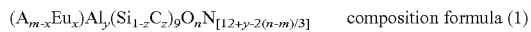

composition formula (1)

wherein the element A is at least one element selected from the group of magnesium (Mg), calcium (Ca), strontium (Sr) and barium (Ba), and m, x, z and n satisfy the relation: 3<m<5, 0≤y<2, 0<x<1, 0<z<1, and 0<n<10.

This composition formula (1) is shown with constant atomic ratio of silicon and carbon being 9. In addition, atomic ratio [12+y−2(n−m)/3] of nitrogen (N) in this composition formula (1) is calculated such that sum of atomic ratios of respective elements in the composition formula (1) will be neutral. In other words, assuming that the atomic ratio of nitrogen (N) in composition formula (1) is δ and that charges of the respective elements constituting composition formula (1) are compensated, the following formula will hold: 2m+3y+4×9−2n−3δ=0. From this formula, the atomic ratio of nitrogen (N) δ is calculated as follows: δ=12+y−2(n−m)/3.

Furthermore, the red phosphor represented by this composition formula (1) has a crystal structure belonging to orthorhombic space group Pmn21 and contains carbon (C) as a constituent element. The carbon has a function to remove excessive oxygen (O) during generation process and adjust oxygen amount.

The red phosphor having this constitution is a chemically stable and highly efficient phosphor that absorbs light in a blue wavelength range and has an emission peak wavelength in a red wavelength range (for example, a wavelength between 620 nm and 770 nm), so that this phosphor is suitable for use in applications such as high color gamut back lights and Light Emitting Diodes (LEDs) having high color rendering properties.

2. Conventional Method for Manufacturing Red Phosphor

A conventional method for manufacturing a red phosphor will be explained hereinafter with reference to the flowchart of FIG. 1.

Firstly, as shown in FIG. 1, raw material mixing step S101 is performed. The starting compounds respectively containing the elements constituting composition formula (1) are mixed by a dry mixing within a glove box filled with nitrogen atmosphere. More particularly, in this dry mixing, the starting compounds are milled and mixed within an agate mortar to form a mixture.

As for the starting compounds containing the elements constituting composition formula (1), a carbonate compound of the element A (for example, strontium carbonate ($SrCO_3$), calcium carbonate ($CaCO_3$) and the like), europium nitride (EuN), silicon nitride ($Si_3N_4$), aluminum nitride (AlN) and melamine ($C_3H_6N_6$) are prepared. The respective starting compounds are weighed to a predetermined molar ratio so that the elements constituting composition formula (1) contained in the prepared starting compounds satisfy the atomic ratio of formula (1). Melamine, which is used as a flux, is added at a predetermined ratio with respect to the total mole number of strontium carbonate, europium nitride, silicon nitride and aluminum nitride. The weighed respective starting compounds are then mixed by dry mixing to form a mixture.

Next, primary firing step S102 is performed. In this primary firing step, the above described mixture is fired to form a first fired product that is a precursor of a red phosphor. In particular, the mixture is heat-processed for 2 hours within a melting pot made of boron nitride (BN) at a $H_2$ gas concentration of 75% and a heat process temperature of 1400° C.

This primary firing step thermally decomposes melamine having a melting point less than 250° C. The thermally decomposed carbon (C) and hydrogen (H) are combined with a part of oxygen (O) contained in strontium carbonate into carbonic acid gas (CO or $CO_2$) or $H_2O$, Since the carbonic acid gas or $H_2O$ is vaporized, a part of oxygen is removed from the strontium carbonate in the first fired product. In addition, nitrogen (N) contained in the decomposed melamine promotes reduction and nitridization.

Next, first milling step S103 is performed. In this first milling step, the first fired product is milled to form a first powder. In particular, the first fired product is milled by using an agate mortar within a glove box filled with nitrogen atmosphere, and then filtered with a #100 mesh (having an aperture size of 200 μm) to obtain the first powder.

Next, secondary firing step S104 is performed. In this secondary firing step, the first powder is heat-processed to form a second fired product. In particular, the first powder is heat-processed for 2 hours within a melting pot made of boron nitride (BN) in nitrogen ($N_2$) atmosphere at an increased pressure of 0.85 MPa and a heat process temperature of 1800° C.

Next, second milling step S105 is performed. In this second milling step, the second fired product is milled to form a second powder. In particular, the second fired product is milled by using an agate mortar within a glove box filled with nitrogen atmosphere, and then filtered with a #420 mesh (having an aperture size of 26 μm).

The above described process produces a red phosphor represented by composition formula (1) containing respective elements with an atomic ratio mixed in raw material mixing step S101.

However, in this kind of conventional manufacturing method, raw material mixing step S101 performed by dry mixing (milling and mixing by using a mortar) tends to cause composition nonuniformity in the mixture so that a uniform red phosphor might not be obtained.

Furthermore, secondary firing step S104, increasing pressure under a high temperature, narrows soaking zone in the heating furnace (around ϕ100), thereby limiting firing efficiency. In addition, specialized and high-cost facilities are necessary since the primary firing step S101 requires installation of a safety device due to the heat-process under a strong reducing atmosphere in which hydrogen concentration exceeds the explosion limit of 4% and the secondary firing step S104 requires a heating furnace having a tolerance against high temperature and high pressure due to the pressurizing-process under a high temperature.

Consequently, conventional manufacturing method, causing composition nonuniformity in the mixture, limiting firing efficiency, and requiring a strong reducing atmosphere and a condition of high temperature and high pressure, hardly improves productivity.

3. Method for Manufacturing Red Phosphor

Figure 2:
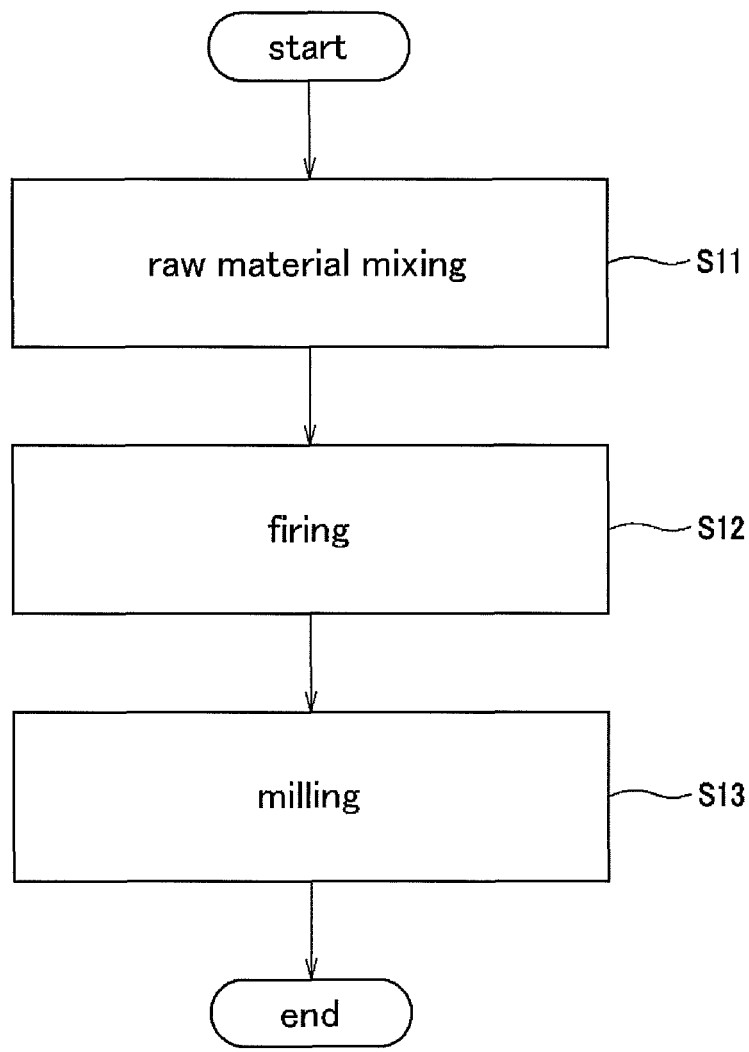
FIG. 2. is a flowchart showing a method for manufacturing a red phosphor according to one embodiment of the present invention.

A method for manufacturing red phosphor according to one embodiment of the present invention will be explained hereinafter with reference to the flowchart of FIG. 2. This method for manufacturing red phosphor according to one embodiment of the present invention uses a nitrogen-free europium such as europium oxide ($Eu_2O_3$), europium acetate ($Eu(CH_3COO)_3.nH_2O$) and europium carbonate ($Eu_2(CO_3)_3$) as a source of europium that is an augmenting agent. This allows a mixing by a wet process, thereby preventing composition nonuniformity in the mixture and improving productivity.

Firstly, in a raw material mixing step S11, starting compounds containing the elements constituting composition formula (1) are mixed to produce a mixture. In particular, the mixture is produced by mixing an element A-containing compound, a nitrogen-free europium, a silicon-containing compound, an aluminum-containing compound and a carbon-containing reducing agent with an atomic ratio among element A, europium (Eu), silicon (Si), aluminum (Al) and carbon (C) being a value represented by composition formula (1).

It is preferable to use a carbonate compound or an oxide of the element A (at least one of Mg, Ca, Sr and Ba) as the element A-containing compound, silicon nitride, silicon oxide ($SiO_2$) and the like as the silicon-containing compound, aluminum nitride, aluminum oxide ($Al2O_3$) and the like as the aluminum-containing compound and melamine, urea and the like as the carbon-containing reducing agent.

In the case that the carbon-containing reducing agent is melamine, addition amount of the melamine is preferably equal to or less than 65% of the total mole number of carbonate compound of the element A, nitrogen-free europium, silicon nitride and aluminum nitride. The melamine amount equal to or less than 65% will realize maximum peak intensity ratio and improve internal quantum efficiency.

The mixing in this embodiment preferably uses wet process capable of avoiding composition nonuniformity in the mixture, although both of wet process and dry process may be used. In particular, the wet process is performed by using ethanol as a solvent, stirring the respective starting compounds, filtering them under a reduced pressure to separate precipitate, drying the precipitate, and filtering it by using, for example, #110 mesh. This wet type mixing does not require the use of glove box, thereby improving operational efficiency.

Next, firing step S12 is performed by filling precursor mixture into a heating furnace and firing it. This firing step S12 is preferably performed under ordinary pressure (atmospheric pressure). This can prevent the soaking zone in the heating furnace from narrowing (around ϕ100), thereby avoiding firing efficiency limitation.

Furthermore, the firing step S12 is preferably performed at a $H_2$ gas concentration equal to or less than 80%, more preferably, equal to or less than 4%. The $H_2$ gas concentration equal to or less than 4% eliminates the necessity of installation of a safety device which might otherwise be required for a heat-process under a strong reducing atmosphere in which hydrogen concentration exceeds the explosion limit of 4%. Furthermore, this embodiment allows a firing in nitrogen atmosphere having a hydrogen concentration of 0%.

In addition, the firing step S12 is preferably performed at a temperature range of 1400° C. to 1800° C. A red phosphor having a high peak intensity can be obtained by the firing at this temperature range.

Alternatively, the firing step S12 may performed by two steps of primary and secondary firing steps. In this case, composition nonuniformity in the red phosphor can be prevented by performing a first milling step after the primary firing step.

In the case of using, for example, melamine as carbon-containing reducing agent and strontium carbonate as the element A-containing compound in this firing step S12, the melamine is thermally decomposed and carbon (C) and hydrogen (H) are combined with a part of oxygen (O) contained in the strontium carbonate into carbonic acid gas (CO or $CO_2$) or $H_2O$, Since the carbonic acid gas or $H_2O$ is vaporized, a part of oxygen is removed from the strontium carbonate in the fired product. In addition, nitrogen (N) contained in the decomposed melamine promotes reduction and nitridization.

Next, milling step S13 is performed. In this milling step, the fired product is milled by using an agate mortar within a glove box filled with nitrogen atmosphere, and then filtered with a #420 mesh (having an aperture size of 26 µm).

The above described process produces a red phosphor represented by composition formula (1) containing respective elements with an atomic ratio mixed in raw material mixing step S11. This red phosphor has an excellent light-emitting property as demonstrated in examples.

4. Constitution of Red Phosphor with Excellent Light-Emitting Property

The inventors of the present invention found that an excellent emission intensity can be achieved when X-ray diffraction (XRD) spectrum of the above described red phosphor containing europium (Eu), silicon (Si), aluminum (Al), carbon (C), oxygen (O) and nitrogen (N) shows a specific diffraction pattern.

In particular, it was found that a high emission intensity can be achieved when the peak intensity existing at a position corresponding to a diffraction angle (2θ) of 36° to 36.6° caused by orthorhombic space group Pmn21 (112) plane (denoted as (112) plane hereinafter) has a sufficiently large value with comparison to the peak intensity existing at a position corresponding to a diffraction angle (2θ) of 35° to 36° caused by orthorhombic space group Pmn21 (113) plane (denoted as (113) plane hereinafter).

As described above, the red phosphor according to the present invention is manufactured by mixing an element (A), a nitrogen-free europium, a silicon-containing compound, an aluminum-containing compound and a carbon-containing reducing agent so as to form a mixture, with the atomic ratio among element (A), europium (Eu), silicon (Si), aluminum (Al) and carbon (C) being a value represented by composition formula (1), firing the mixture, and milling the first fired mixture, and the X-ray diffraction pattern has the peak intensity existing at a position corresponding to a diffraction angle of 36° to 36.6° that is 0.65 times or more than the peak intensity existing at a position corresponding to a diffraction angle of 35° to 36°.

The crystal structure having this diffraction peak intensity ratio can achieve an emission peak intensity ratio of 1.5 or more (YAG standard). It should be noted that different diffraction peak intensity ratio means different crystal structure of the red phosphor.

Moreover, the red phosphor according to the present invention has an X-ray diffraction pattern in which the peak intensity existing at a position corresponding to a diffraction angle of 36° to 36.6° is 0.65 times or more than the peak intensity existing at a position corresponding to a diffraction angle of 35° to 36° even if the carbon content (Z) in the red phosphor shown in the composition formula (1) is 0.072 or less, thereby showing an excellent light-emitting property.

Accordingly, the charge amount of melamine can be reduced in the manufacturing of the red phosphor according to the present invention, thereby preventing adverse effect such as clogging of ducts of a device with melamine.

Furthermore, the inventors of the present invention found that a high quantum efficiency can be achieved when a photoluminescence excitation (PLE) spectrum shows a predetermined light-emitting property. Particularly, in the photoluminescence excitation (PLE) spectrum of the red phosphor according to the present invention, the relative value of an emission intensity at an excitation wavelength of 550 nm relative to the value of an emission intensity at an excitation wavelength of 400 nm set equal to 1 (denoted as 550 nm PLE intensity/440 nm PLE intensity hereinafter) is 0.48 or more.

Furthermore, the red phosphor according to the present embodiment preferably fulfills the condition of $0.05 \leq x \leq 0.15$ in the composition formula (1). The emission intensity peak of the red phosphor shown in composition formula (1) changes in accordance with the europium (Eu) concentration (x), and the Eu concentration (x) within this range can achieve a high external quantum efficiency.

5. Exemplary Constitution of White Light Source

A white light source according to one embodiment of the present invention will be explained hereinafter with reference to the schematic cross-sectional view of FIG. 3.

Figure 3:
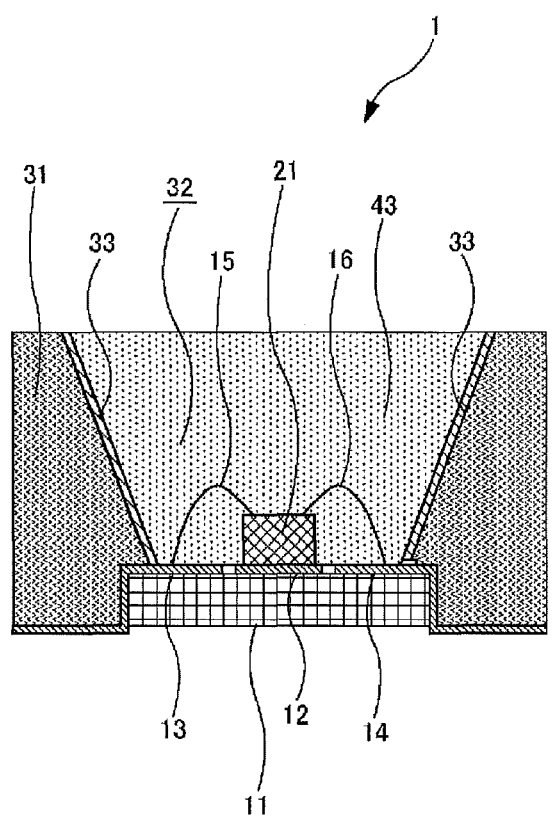
FIG. 3 is a schematic cross-sectional view of a white light source according to one embodiment of the present invention.

As shown in FIG. 3, a white light source 1 includes a blue light-emitting diode 21 on a pad 12 formed on a device substrate 11. The device substrate 11 is provided with insulated electrodes 13 and 14 to supply electrical power for activating the blue light-emitting diode 21, and the respective electrodes 13 and 14 are connected to the blue light-emitting diode 21 through lead wires 15 and 16, for example.

In addition, a resin layer 31 is provided around the blue light-emitting diode 21 and the resin layer 31 has an opening 32 that opens above the blue light-emitting diode 21. This opening 32 is formed by an inclined plane having a wider opening area in the emission direction of the blue light-emitting diode 21 and a reflective film 33 is formed on the inclined plane. In other words, in the resin layer 31 having the opening 32 formed as mortar-shape, the wall of the opening 32 is covered with the reflective film 33 and the blue light-emitting diode 21 is disposed at the bottom of the opening 32. The white light source 1 is constituted by filling a kneaded material 43 formed by kneading a transparent resin with a red phosphor and a green phosphor into the opening 32 such that the kneaded material 43 covers the blue light-emitting diode 21.

A red phosphor represented by the above described composition formula (1) is used as this red phosphor. This red phosphor has a peak emission wavelength in a red wavelength range (for example, a wavelength between 620 nm and 770 nm), a high light-emitting intensity and a high brightness. For this reason, a bright white light with a high color gamut can be obtained by three primary colors of light comprised of blue light of the blue LED, green light of the green phosphor and red light of the red phosphor.

6. Exemplary Constitution of Illumination Apparatus

An illumination apparatus according to one embodiment of the present invention will be explained hereinafter with reference to the schematic plane view of FIG. 4.

Figure 4A:
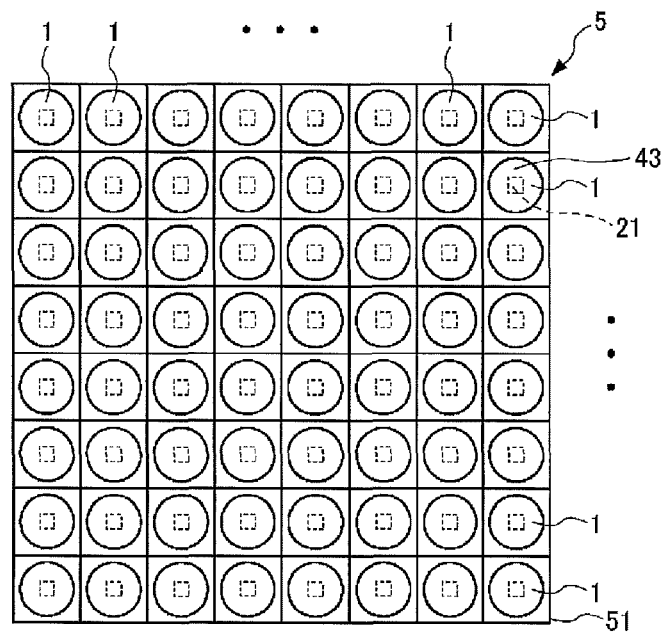
FIG. 4A is a schematic plane view of an exemplary illumination apparatus with a square lattice arrangement and FIG. 4B is a schematic plane view of an exemplary illumination apparatus with an arrangement wherein adjacent rows are shifted by ½ pitch.
Figure 4B:
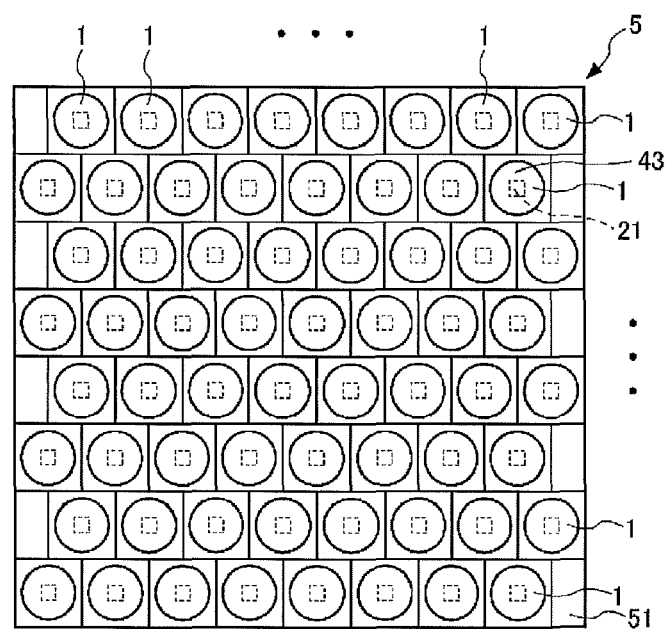

As shown in FIGS. 4A and 4B, an illumination apparatus 5 comprises an illumination substrate 51 on which a plurality of white light sources 1 explained by using FIG. 3 are arranged. Exemplary arrangement of the white light sources may be a square lattice arrangement as shown in FIG. 4A or may be an arrangement wherein adjacent rows are shifted by ½ pitch as shown in FIG. 4B. The shifting amount is not limited to ½ pitch but may be ⅓ pitch or ¼ pitch. Moreover every row or every few rows (for example, every two rows) may be shifted.

Alternatively, although not shown, every column may be shifted by ½ pitch. The shifting amount is not limited to ½ pitch but may be ⅓ pitch or ¼ pitch. Moreover, every column or every few columns (for example, every two columns) may be shifted. The way of shifting of the white light sources 1 has no limitation.

The white light source 1 has a constitution same as the constitution explained by using FIG. 3. That is, the white light source 1 includes a kneaded material 43 formed by kneading a transparent resin with a red phosphor and a green phosphor on the blue light-emitting diode 21. A red phosphor represented by the above described composition formula (1) is used as this red phosphor.

In addition, the illumination apparatus 5 can be used as a back light for a liquid crystal display device since plurality of the white light sources 1 substantially equivalent to point-light emitting devices are two-dimensionally arranged on the illumination substrate 51, which is substantially equivalent to surface emission device. Furthermore, the illumination apparatus 5 can be used for various applications including an ordinary illumination apparatus, an illumination apparatus for photographing and an illumination apparatus for construction site.

The illumination apparatus 5 provides a bright white light with a high color gamut by using the white light source 1. For example, in the case of using it as a backlight of liquid crystal display device, a pure white color with a high brightness can be expressed on the display screen, thereby improving display quality.

7. Exemplary Constitution of Liquid Crystal Display Device

A liquid crystal display device according to one embodiment of the present invention will be explained hereinafter with reference to the schematic configuration view of FIG. 5.

Figure 5:
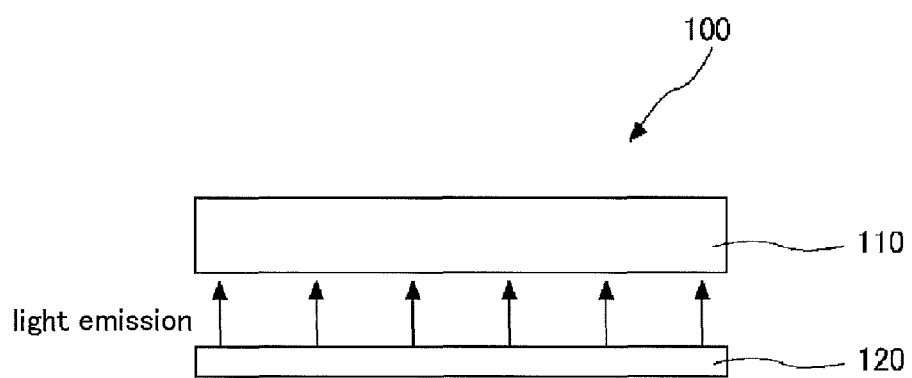
FIG. 5 is a schematic configuration view of a liquid crystal display device according to one embodiment of the present invention.

A liquid crystal display device 100 shown in FIG. 5 includes a liquid crystal display panel 110 having a transparent display unit and a back light 120 provided at a back side (a side opposite to a display surface) of the liquid crystal display panel 110. The illumination apparatus 5 explained by using FIG. 4 is used as this back light 120.

The liquid crystal display device 100 can illuminate the liquid crystal display panel 110 with a bright white light with high color gamut by three primary colors of light by using the illumination apparatus 5. Consequently, a pure white color with a high brightness can be expressed on the display screen of the liquid crystal display panel 110, thereby improving display quality.

EXAMPLES

8. Examples

The present invention is further described below in detail with reference to the following examples, but it should be construed that the invention is in not limited to those examples.

<8.1 Effect of Eu Source Material on Light-Emitting Property>

Light-emitting properties were evaluated with respect to plurality of red phosphors respectively using europium oxide ($Eu_2O_3$), europium acetate ($Eu(CH_3COO)_3 \cdot nH_2O$), europium carbonate ($Eu_2(CO_3)_3$) and europium nitride (EuN) as a source of europium that is an augmenting agent.

[Eu Source: Europium Oxide]

Figure 6:
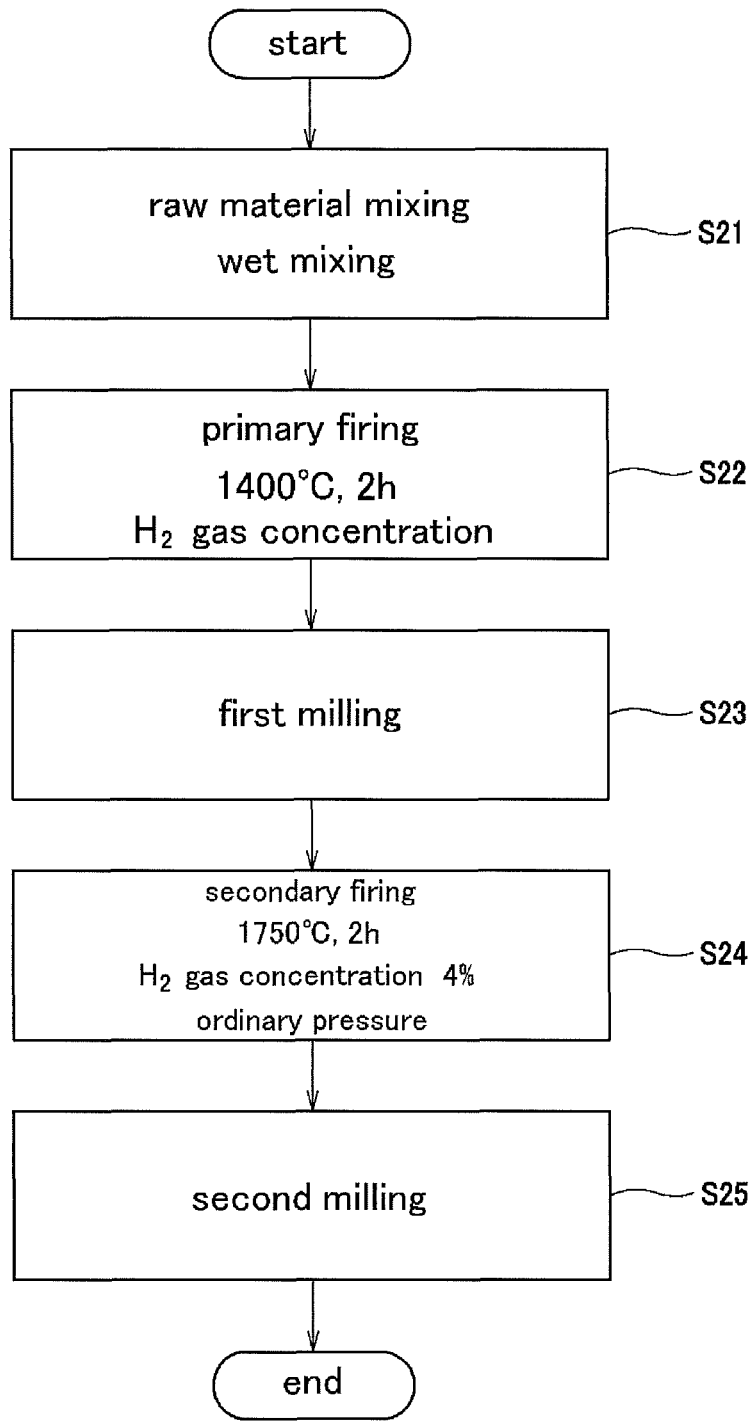
FIG. 6 is a flowchart showing an exemplary manufacturing method (two-step ordinary pressure firing) of a red phosphor.

FIG. 6 is a flowchart showing an exemplary method for manufacturing a red phosphor. In this manufacturing method, europium oxide ($Eu_2O_3$) was used as a source of europium. Furthermore, melamine, which was used as a flux, was added at a predetermined ratio with respect to the total mole number of europium oxide, strontium carbonate, silicon nitride and aluminum nitride.

Raw material mixing step S21 was performed by employing liquid-phase method (wet process), using ethanol as a solvent, stirring the respective starting compounds for 30 minutes, and filtering them under reduced pressure to separate precipitate. The precipitate was dried for eight hours at a temperature of 80° C. and then filtered by using #110 mesh to obtain a precursor mixture.

Primary firing step S22 was performed by weighing the precursor mixture to a predetermined amount, filling the weighed precursor mixture into a melting pot made of boron nitride (BN) and firing the precursor mixture for two hours at a $H_2$ gas concentration of 4% and a heat process temperature of 1400° C.

First milling step S23 was performed by milling the fired product produced in the primary firing step by using an agate mortar and then filtering it with a #100 mesh (having an aperture size of 200 µm) to obtain first powder.

Secondary firing step S24 was performed by firing the first powder within a melting pot made of boron nitride (BN) for two hours at an ordinary pressure, a $H_2$ gas concentration of 4% and a heat process temperature of 1750° C.

Second milling step S25 was performed by milling the secondary fired product by using an agate mortar and then filtering it with a #420 mesh (having an aperture size of 26 µm).

Red phosphors represented by composition formula (2) were obtained by above described two-step ordinary pressure firing. Analysis of respective red phosphors by using an Inductively Coupled Plasma (ICP) optical emission spectrometer revealed that strontium, europium, aluminum and silicon constituting the composition formula (2) contained in the starting compounds were also contained in the red phosphors with a substantially same molar ratio (atomic ratio). In addition, analysis of carbon contents (Z) in the respective red phosphors by using an ICP optical emission spectrometer and combustion in oxygen atmosphere-NDIR detection method (device: EMIA-U511 (HORIBA, Ltd.)) revealed that the carbon contents (Z) were in the range of 0<z<1.

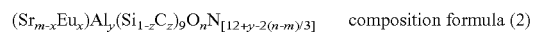

$(Sr_{m-x}Eu_x)Al_y(Si_{1-z}C_z)_9O_nN_{[12+y-2(n-m)/3]}$  composition formula (2)

In this composition formula (2), the following formula will hold: m=3.79, x=0.0663 and y=0.474.

[Eu Source: Europium Acetate]

Red phosphors represented by composition formula (2) (m=3.79, x=0.0663 and y=0.474) were produced by the same manufacturing method as that of the red phosphor using europium oxide shown in the flowchart of FIG. 6 (two-step ordinary pressure firing) except that europium acetate ($Eu(CH_3COO)_3 \cdot nH_2O$) was used as a europium source.

Analysis of the respective red phosphors obtained by the two-step ordinary pressure firing by using ICP optical emission spectrometer revealed that strontium, europium, aluminum and silicon constituting the composition formula (2) contained in the starting compounds were also contained in the red phosphors with a substantially same molar ratio (atomic ratio). In addition, analysis of carbon contents (Z) in the respective red phosphors by using an ICP optical emission spectrometer and combustion in oxygen atmosphere-NDIR detection method revealed that the carbon contents (Z) were in the range of 0<z<1.

[Eu Source: Europium Carbonate]

Figure 7:
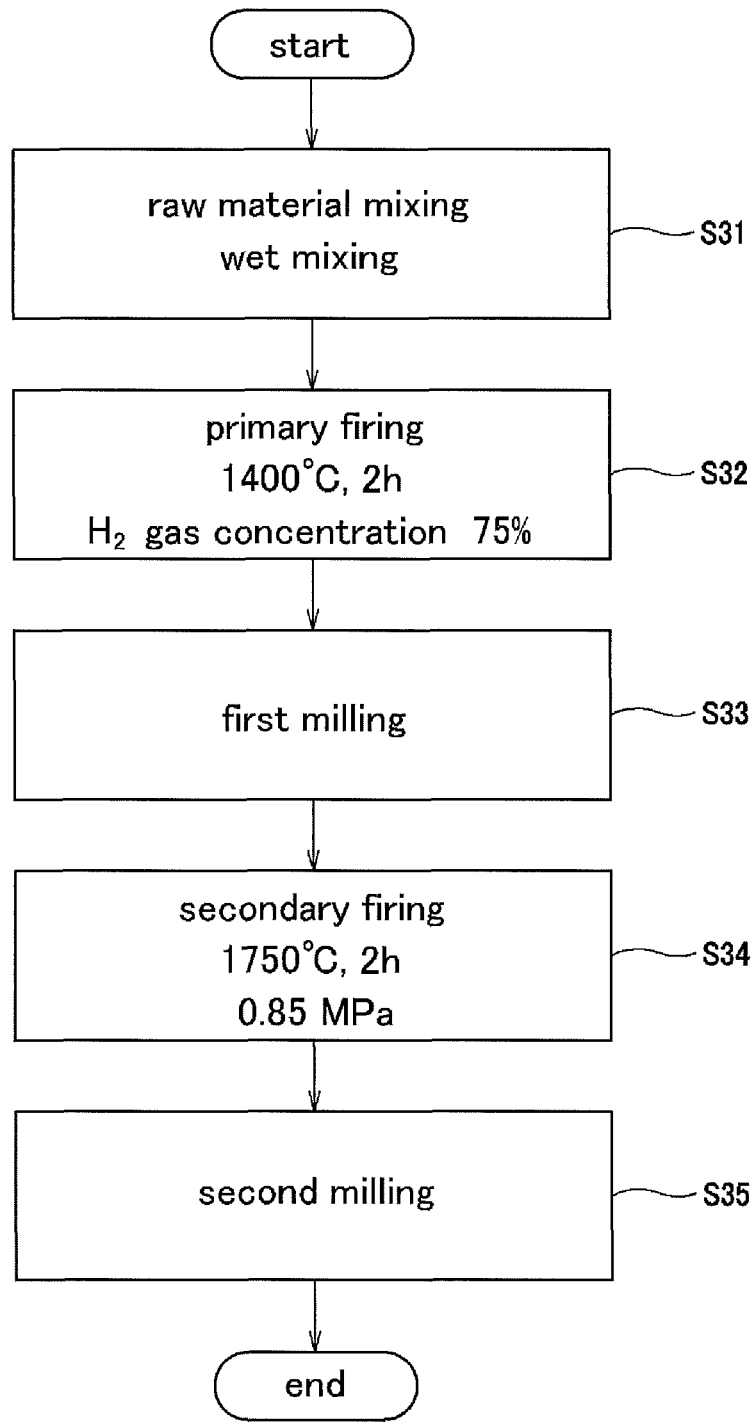
FIG. 7 is a flowchart showing an exemplary manufacturing method (two-step pressurized firing) of a red phosphor.

FIG. 7 is a flowchart showing an exemplary method for manufacturing a red phosphor. In this manufacturing method, europium carbonate ($Eu_2(CO_3)_3$) was used as a europium source. Furthermore, melamine, which was used as a flux, was added at a predetermined ratio with respect to the total mole number of europium carbonate, strontium carbonate, silicon nitride and aluminum nitride.

Raw material mixing step S31 was performed by employing liquid-phase method (wet process), using ethanol as a solvent, stirring the respective starting compounds for 30 minutes, and filtering them under reduced pressure to separate precipitate. The precipitate was dried for eight hours at a temperature of 80° C. and then filtered by using #110 mesh to obtain a precursor mixture.

Primary firing step S32 was performed by weighing the precursor mixture to a predetermined amount, filling the weighed precursor mixture into a melting pot made of boron nitride (BN) and firing the precursor mixture for two hours at a $H_2$ gas concentration of 75% and a heat process temperature of 1400° C.

First milling step S33 was performed by milling the fired product produced in the primary firing step by using an agate mortar and then filtering it with a #100 mesh (having an aperture size of 200 μm) to obtain first powder.

Secondary firing step S34 was performed by firing the first powder within a melting pot made of boron nitride (BN) for two hours under a pressurized nitrogen (N2) atmosphere of 0.85 MPa and a heat process temperature of 1750° C.

Second milling step S35 was performed by milling the secondary fired product by using an agate mortar and then filtering it with a #420 mesh (having an aperture size of 26 μm).

Red phosphors represented by composition formula (2) (m=3.79, x=0.0663 and y=0.474) were obtained by above described two-step pressurized firing. Analysis of the respective red phosphors obtained by the two-step pressurized firing by using ICP optical emission spectrometer revealed that strontium, europium, aluminum and silicon constituting the composition formula (2) contained in the starting compounds were also contained in the red phosphors with a substantially same molar ratio (atomic ratio). In addition, analysis of carbon contents (Z) in the respective red phosphors by using an ICP optical emission spectrometer and combustion in oxygen atmosphere-NDIR detection method revealed that the carbon contents (Z) were in the range of 0<z<1.

[Eu Source: Europium Nitride]

In the case of using europium nitride (EuN) as a europium source, it is difficult to use wet mixing, and the conventional manufacturing method shown in FIG. 1 was therefore used to produce red phosphors.

Accordingly, the raw material mixing step S101 was performed by adding melamine, which was used as a flux, at a predetermined ratio with respect to the total mole number of europium nitride, strontium carbonate, silicon nitride and aluminum nitride and milling and mixing the starting compounds within an agate mortar within a glove box filled with nitrogen atmosphere to form a mixture.

Primary firing step S102 was performed by weighing the mixture to a predetermined amount, filling the weighed mixture into a melting pot made of boron nitride (BN) and firing the mixture for two hours at a $H_2$ gas concentration of 75% and a heat process temperature of 1400° C.

First milling step S103 was performed by milling the fired product fired by the primary firing by using an agate mortar within a glove box filled with nitrogen atmosphere and then filtering it with a #100 mesh (having an aperture size of 200 μm) to obtain first powder.

Secondary firing step S104 was performed by firing the first powder within a melting pot made of boron nitride (BN) for two hours under a pressurized nitrogen (N2) atmosphere of 0.85 MPa and a heat process temperature of 1750° C.

Second milling step S105 was performed by milling the secondary fired product by using an agate mortar within a glove box filled with nitrogen atmosphere and then filtering it with a #420 mesh (having an aperture size of 26 μm).

Red phosphors represented by composition formula (2) (m=3.79, x=0.0663 and y=0.474) were obtained by above described conventional manufacturing method. Analysis of the respective red phosphors obtained by the conventional manufacturing method by using ICP optical emission spectrometer revealed that strontium, europium, aluminum and silicon constituting the composition formula (2) contained in the starting compounds were also contained in the red phosphors with a substantially same molar ratio (atomic ratio). In addition, analysis of carbon contents (Z) in the respective red phosphors by using an ICP optical emission spectrometer and combustion in oxygen atmosphere-NDIR detection method revealed that the carbon contents (Z) were in the range of 0<z<1.

[Evaluation of Light-Emitting Property]

Figure 8:
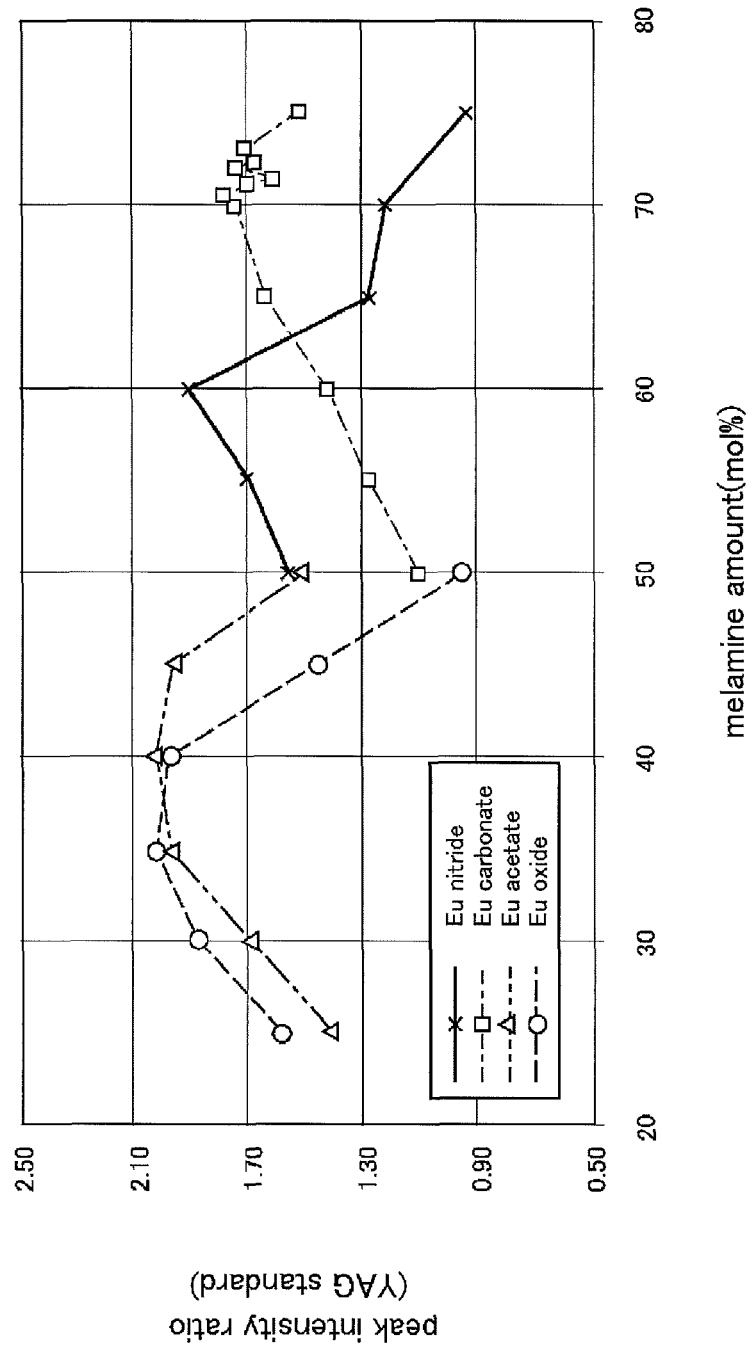
FIG. 8 is a graph showing peak intensity ratios (YAG standard) of respective red phosphors produced by using $Eu_2O_3$, $Eu(CH_3COO)_3 \cdot nH_2O$, $Eu_2(CO_3)_3$ and EuN as a source of europium.
Figure 9:
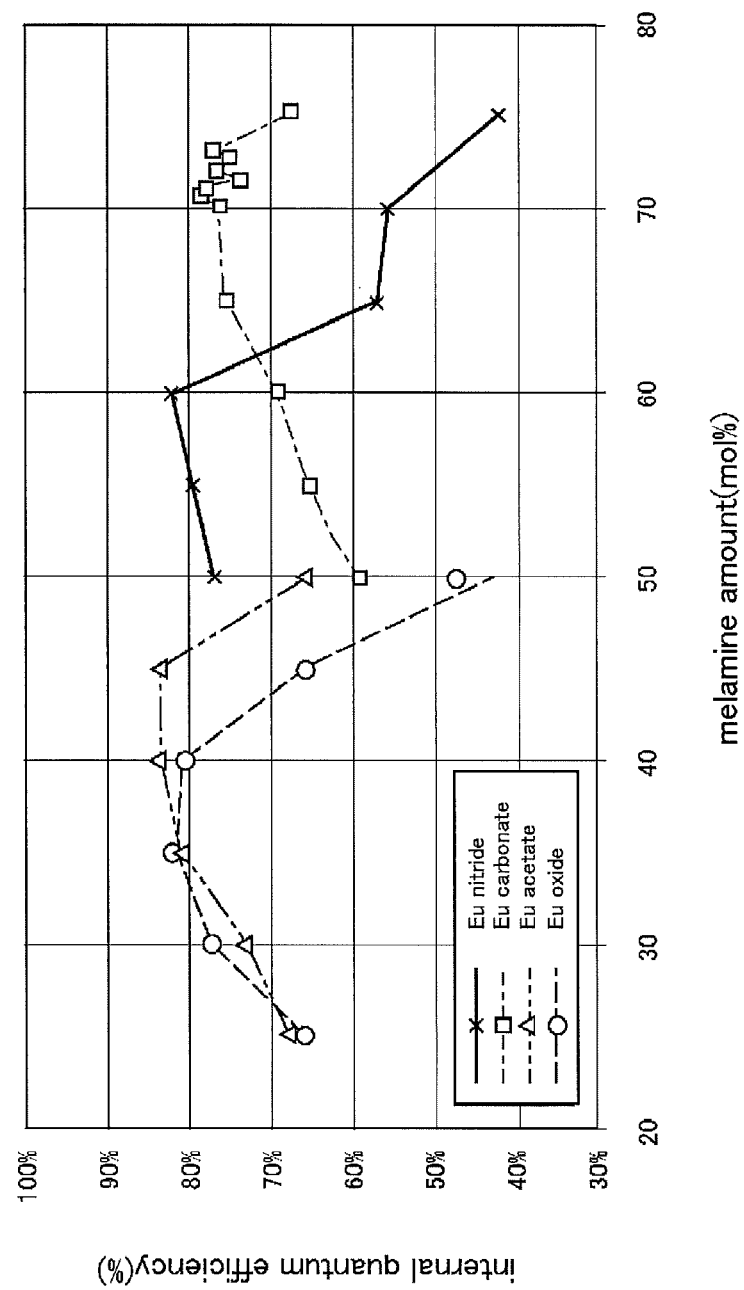
FIG. 9 is a graph showing internal quantum efficiencies of respective red phosphors produced by using $Eu_2O_3$, $Eu(CH_3COO)_3 \cdot nH_2O$, $Eu_2(CO_3)_3$ and EuN as a source of europium.

FIGS. 8 and 9 are graphs respectively showing peak intensity ratios (YAG standard) and internal quantum efficiencies of respective red phosphors produced by using europium oxide ($Eu_2O_3$), europium acetate ($Eu(CH_3COO)_3 \cdot nH_2O$), europium carbonate ($Eu_2(CO_3)_3$) and europium nitride (EuN) as a source of europium. The peak intensity ratios were measured by using a fluorescence spectrophotometer FP-6500 produced by JASCO Corporation, filling phosphor powder into dedicated cell and illuminating blue excitation light with a wavelength of 450 nm. The internal quantum efficiencies were measured also by using the fluorescence spectrophotometer FP-6500 produced by JASCO Corporation. The internal quantum efficiencies of red phosphors were calculated from the resulting fluorescence spectra by using a quantum efficiency measuring software appended to the fluorescence spectrophotometer.

It was revealed that, in the case of manufacturing red phosphors by using europium oxide, europium acetate and europium carbonate as a source of europium acting as an augmenting agent instead of europium nitride being unstable in the air, optimal values of melamine amount were different from each other. In addition, maximum value of peak intensity ratio (YAG standard) of europium nitride was 1.91, whereas that of europium carbonate was 1.75, that of europium acetate was 2.03 and that of europium oxide was 2.03, which revealed that a red phosphor obtained by using nitrogen-free europium had a peak intensity nearly equal to or larger than that of a red phosphor obtained by using europium nitride. Furthermore, maximum internal quantum efficiency of europium nitride was 82.2%, whereas that of europium carbonate was 78.3%, that of europium acetate was 83.3% and that of europium oxide was 81.4%, which revealed that a red phosphor obtained by using nitrogen-free europium had a maximum internal quantum efficiency nearly equal to that of a red phosphor obtained by using europium nitride.

Moreover, since europium oxide, europium acetate and europium carbonate are stable in the air, they eliminates the necessity of storage in an ordinary desiccator as well as weighing and mixing in a glove box, thereby improving operational efficiency.

<8.2 Effect of Mixing Method on Light-Emitting Property>

Next, wet mixing was compared with dry mixing by using europium oxide ($Eu_2O_3$) as a source of europium. Wet mixing was performed by using ethanol as a solvent, stirring the respective starting compounds for 30 minutes, filtering them under reduced pressure to separate precipitate, drying the precipitate for eight hours at a temperature of 80° C. and then filtering it by using #110 mesh to obtain a precursor mixture. Dry mixing was performed by milling and mixing starting compounds within a mortar to form a mixture. Subsequently, red phosphors represented by composition formula (2) (m=3.79, x=0.0663 and y=0.474) were produced by the two-step ordinary pressure firing shown in the flowchart of FIG. 6.

Analysis of red phosphors obtained by these wed mixing and dry mixing followed by the two-step ordinary pressure firing by using an ICP optical emission spectrometer revealed that strontium, europium, aluminum and silicon constituting the composition formula (2) contained in the starting compounds were also contained in the red phosphors with a substantially same molar ratio (atomic ratio). In addition, analysis of carbon contents (Z) in the respective red phosphors by using an ICP optical emission spectrometer and combustion in oxygen atmosphere-NDIR detection method revealed that the carbon contents (Z) were in the range of 0<z<1.

Figure 10:
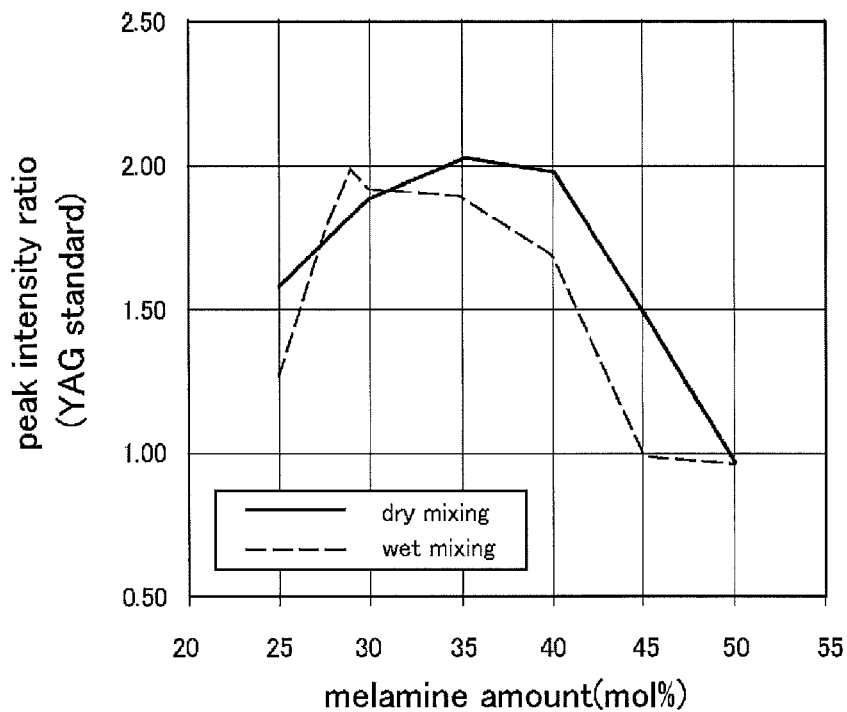
FIG. 10 is a graph showing peak intensity ratios (YAG standard) of respective red phosphors produced by wet mixing or dry mixing.
Figure 11:
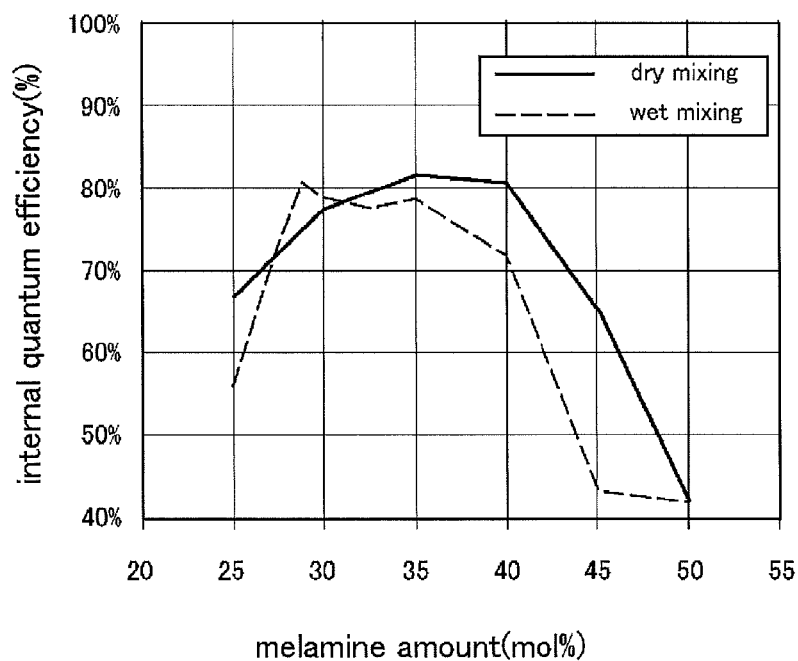
FIG. 11 is a graph showing internal quantum efficiencies of respective red phosphors produced by wet mixing or dry mixing.

FIGS. 10 and 11 are graphs respectively showing peak intensity ratios (YAG standard) and internal quantum efficiencies of respective red phosphors produced by wet mixing or dry mixing.

It was revealed that, optimal values of melamine amount were different between a red phosphor produced by wet mixing and a red phosphor produced by dry mixing. In addition, maximum value of peak intensity ratio (YAG standard) of a red phosphor produced by dry mixing was 2.03 whereas that of a red phosphor produced by wet mixing was 1.99, which revealed that the red phosphor produced by wet mixing had a peak intensity nearly equal to that of the red phosphor produced by dry mixing. Furthermore, maximum internal quantum efficiency of a red phosphor produced by dry mixing was 81.5% whereas that of a red phosphor produced by wet mixing was 80.7%, which revealed that the red phosphor produced by wet mixing had a maximum internal quantum efficiency nearly equal to that of the red phosphor produced by dry mixing.

<8.3 Effect of Pressure During Firing on Light-Emitting Property>

Next, comparison was made between firing with pressurization and firing without pressurization by using europium oxide ($Eu_2O_3$) as a source of europium. Pressurized firing was performed by the two-step pressurized firing shown in the flowchart of FIG. 7. Particularly, primary firing step was performed for two hours at a $H_2$ gas concentration of 75% and a heat process temperature of 1400° C., and secondary firing step was performed for two hours under a pressurized nitrogen (N2) atmosphere of 0.85 MPa and a heat process temperature of 1750° C. Red phosphors represented by composition formula (2) (m=3.79, x=0.0663 and y=0.474) were thus produced.

Analysis of red phosphors obtained by this pressurized firing by using an ICP optical emission spectrometer revealed that strontium, europium, aluminum and silicon constituting the composition formula (2) contained in the starting compounds were also contained in the red phosphors with a substantially same molar ratio (atomic ratio). In addition, analysis of carbon contents (Z) in the respective red phosphors by using an ICP optical emission spectrometer and combustion in oxygen atmosphere-NDIR detection method revealed that the carbon contents (Z) were in the range of 0<z<1.

In the case of performing primary firing step for two hours at a $H_2$ gas concentration of 75% and a heat process temperature of 1400° C., and secondary firing step for two hours by using nitrogen ($N_2$) atmosphere ($H_2$ gas concentration of 75%) with an atmospheric pressure (ordinary pressure) and a heat process temperature of 1750° C., the content within the melting pot was melt. On the other hand, when using reducing atmosphere having a $H_2$ gas concentration of 4% under an ordinary pressure condition, the content within the melting pot was not melt and a red phosphor was able to be obtained.

That is, in this ordinary pressure firing, primary firing step was performed for two hours at a $H_2$ gas concentration of 75% and a heat process temperature of 1400° C., and secondary firing step was performed for two hours by using reducing atmosphere having a $H_2$ gas concentration of 4% under an ordinary pressure condition and a heat process temperature of 1750° C. Red phosphors represented by composition formula (2) (m=3.79, x=0.0663 and y=0.474) were thus produced.

Analysis of red phosphors obtained by this ordinary pressure firing by using an ICP optical emission spectrometer revealed that strontium, europium, aluminum and silicon constituting the composition formula (2) contained in the starting compounds were also contained in the red phosphors with a substantially same molar ratio (atomic ratio). In addition, analysis of carbon contents (Z) in the respective red phosphors by using an ICP optical emission spectrometer and combustion in oxygen atmosphere-NDIR detection method revealed that the carbon content (Z) were in the range of 0<z<1.

Figure 12:
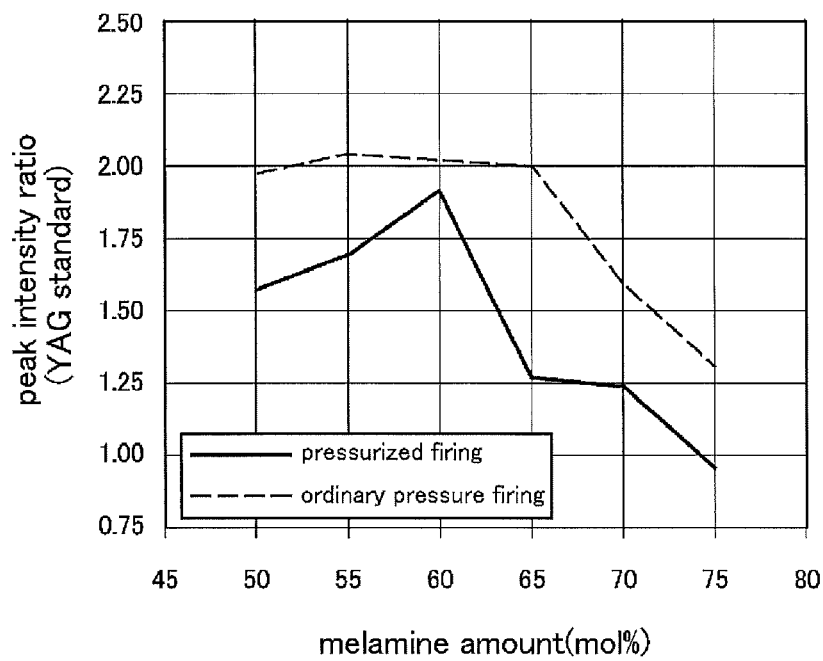
FIG. 12 is a graph showing peak intensity ratios (YAG standard) of respective red phosphors produced by pressurized firing and ordinary pressure firing.
Figure 13:
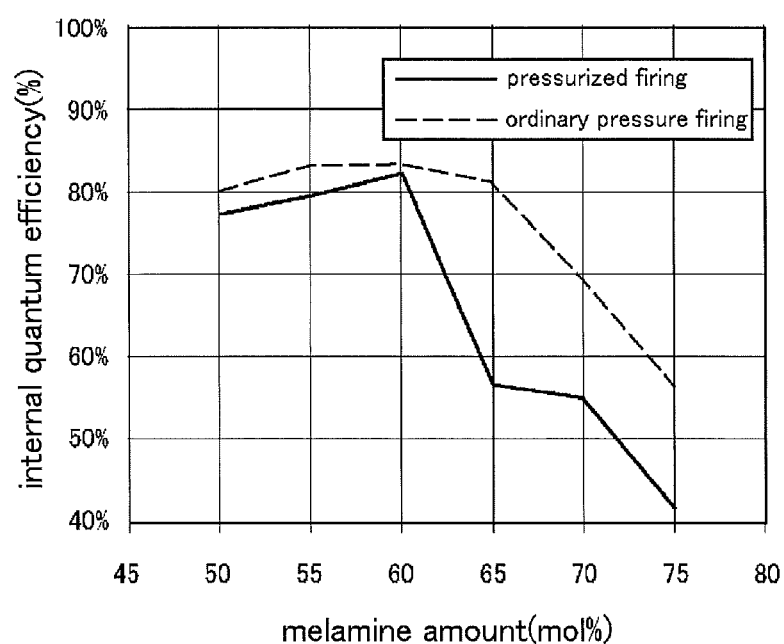
FIG. 13 is a graph showing internal quantum efficiencies of respective red phosphors produced by pressurized firing and ordinary pressure firing.

FIGS. 12 and 13 are graphs respectively showing peak intensity ratios (YAG standard) and internal quantum efficiencies of respective red phosphors produced by pressurized firing and ordinary pressure firing.

It was revealed that, optimal values of melamine amount were different between a red phosphor produced by pressurized firing and a red phosphor produced by ordinary pressure firing. In addition, maximum value of peak intensity ratio (YAG standard) of a red phosphor produced by pressurized firing was 1.91 whereas that of a red phosphor produced by ordinary pressure firing was 2.04, which revealed that the red phosphor produced by ordinary pressure firing had a peak intensity larger than that of the red phosphor produced by pressurized firing. Furthermore, maximum internal quantum efficiency of a red phosphor produced by pressurized firing was 82.2% whereas that of a red phosphor produced by ordinary pressure firing was 83.3%, which revealed that the red phosphor produced by ordinary pressure firing had a maximum internal quantum efficiency larger than that of the red phosphor produced by pressurized firing.

In addition, it was revealed that, even in the case of using a condition of nitrogen atmosphere having a hydrogen concentration of 0% in the secondary firing, setting melamine amount to 50 mol % or less could avoid melting of the content, thereby enabling production of a red phosphor.

<8.4 Effect of $H_2$ Gas Concentration During Firing on Light-Emitting Property>

Next, effect of $H_2$ gas concentration during primary firing was evaluated by using europium oxide ($Eu_2O_3$) as a source of europium. In this evaluation, red phosphors represented by composition formula (2) (m=3.79, x=0.0663 and y=0.474) were produced by processes shown in the flowchart of FIG. 7 except that $H_2$ gas concentrations during primary firings were set to 4%, 50% and 75%, respectively.

Analysis of the respective red phosphors obtained by the two-step pressurized firing by using ICP optical emission spectrometer revealed that strontium, europium, aluminum and silicon constituting the composition formula (2) contained in the starting compounds were also contained in the red phosphors with a substantially same molar ratio (atomic ratio). In addition, analysis of carbon contents (Z) in the respective red phosphors by using an ICP optical emission spectrometer and combustion in oxygen atmosphere-NDIR detection method revealed that the carbon contents (Z) were in the range of 0<z<1.

Figure 14:
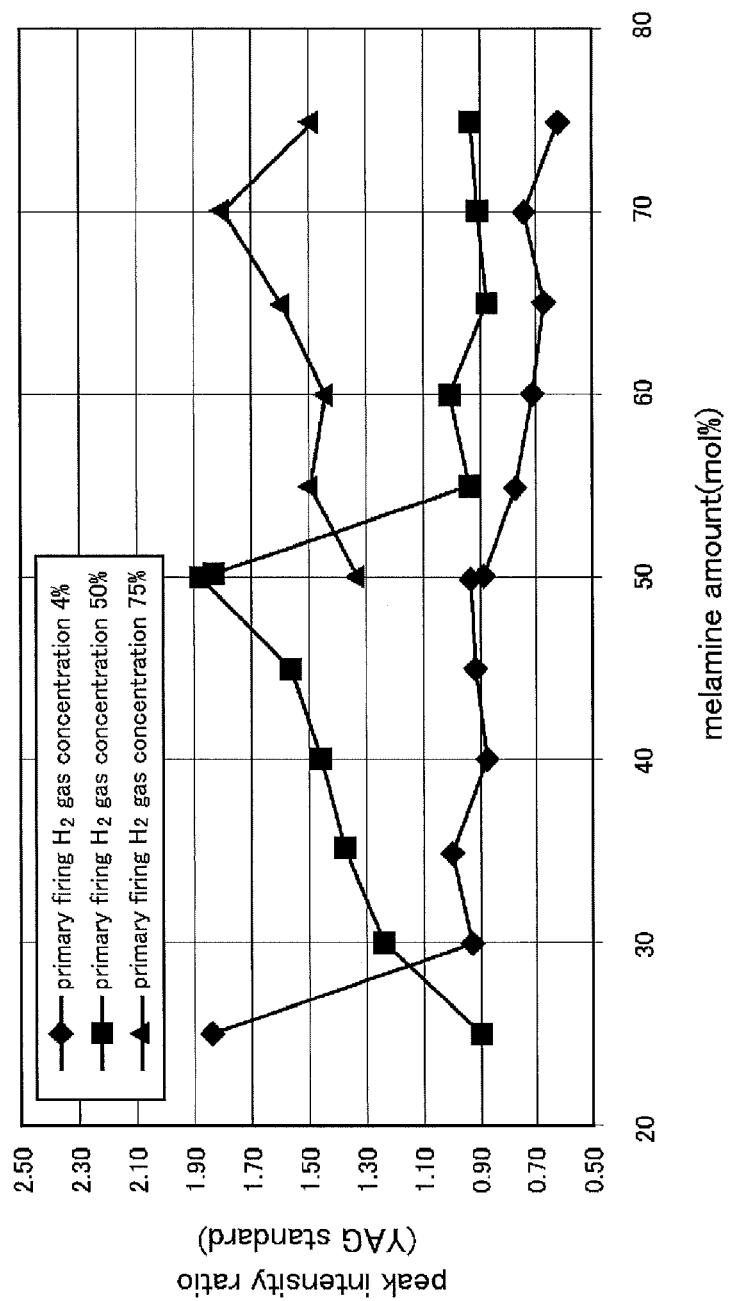
FIG. 14 is a graph showing peak intensity ratios of respective red phosphors produced by using $H_2$ gas concentration of 4%, 50% and 75% during primary firings.

FIG. 14 is a graph showing peak intensity ratios (YAG standard) of respective red phosphors produced by using $H_2$ gas concentration of 4%, 50% and 75% during primary firings.

It was revealed that, optimal values of melamine amount were different among red phosphors respectively produced by using $H_2$ gas concentration of 4%, 50% and 75% during primary firings. Furthermore, it was revealed that in the case of low $H_2$ gas concentration (4%), the maximum value of peak intensity ratio (YAG standard) could be achieved even under a low melamine amount condition, and in the case of high $H_2$ gas concentration (75%), increasing melamine amount could achieve the maximum value of peak intensity ratio (YAG standard).

In addition, it was confirmed that the $H_2$ gas concentration during primary firing could be 0 to 4% and a red phosphor obtained by using $H_2$ gas concentration of 0% during primary firing had a peak intensity ratio (YAG standard) equal to or larger than that of a red phosphor obtained by using $H_2$ gas concentration of 75%.

<8.5 Effect of Number of Times of Firings on Light-Emitting Property>

Next, effect of number of times of firings was evaluated by using europium oxide ($Eu_2O_3$) as a source of europium. In this evaluation, red phosphors represented by composition formula (2) (m=3.79, x=0.0663 and y=0.474) were produced by the two-step ordinary pressure firing shown in FIG. 6 and the two-step pressurized firing shown in FIG. 7.

Analysis of the respective red phosphors obtained by the two-step ordinary pressure firing or the two-step pressurized firing by using ICP optical emission spectrometer revealed that strontium, europium, aluminum and silicon constituting the composition formula (2) contained in the starting compounds were also contained in the red phosphors with a substantially same molar ratio (atomic ratio). In addition, analysis of carbon contents (Z) in the respective red phosphors by using an ICP optical emission spectrometer and combustion in oxygen atmosphere-NDIR detection method revealed that the carbon contents (Z) were in the range of $0<z<1$.

Figure 15:
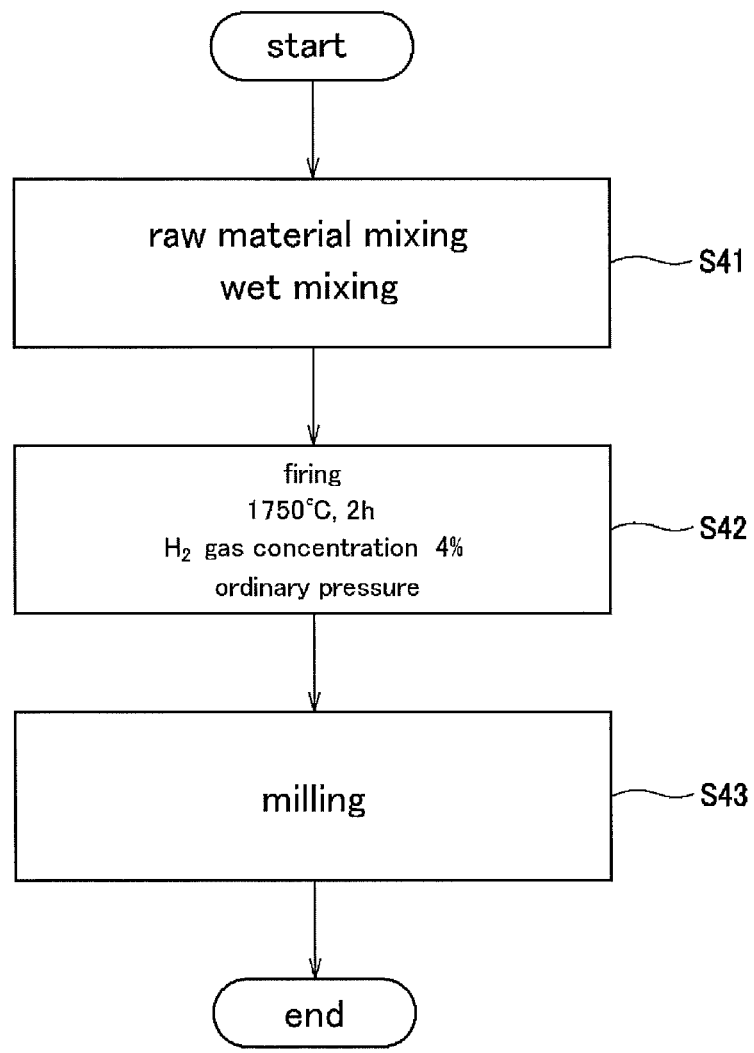
FIG. 15 is a flowchart showing an exemplary manufacturing method (one-step ordinary pressure firing) of a red phosphor.

In addition, in order to reduce the process time, the primary firing (1400° C., 2 h) was omitted from the two-step ordinary pressure firing, thereby performing one-step firing to synthesize a red phosphor. FIG. 15 is a flowchart of this one-step ordinary pressure firing.

In this case, europium oxide ($Eu_2O_3$) was used as a source of europium. Furthermore, melamine, which was used as a flux, was added at a predetermined ratio with respect to the total mole number of europium oxide, strontium carbonate, silicon nitride and aluminum nitride.

Raw material mixing step S41 was performed by employing liquid-phase method (wet process), using ethanol as a solvent, stirring the respective starting compounds for 30 minutes, and filtering them under reduced pressure to separate precipitate. The precipitate was dried for eight hours at a temperature of 80° C. and then filtered by using #110 mesh to obtain a precursor mixture.

Firing step S42 was performed by weighing the precursor mixture to a predetermined amount, filling the weighed precursor mixture into a melting pot made of boron nitride (BN) and firing the precursor mixture for two hours at a $H_2$ gas concentration of 4% and a heat process temperature of 1750° C.

Milling step S43 was performed by milling the fired product by using an agate mortar and then filtering it with a #420 mesh (having an aperture size of 26 μm).

Red phosphors represented by composition formula (2) (m=3.79, x=0.0663 and y=0.474) were obtained by above described one-step ordinary pressure firing. Analysis of the respective red phosphors obtained by this one-step ordinary pressure firing by using ICP optical emission spectrometer revealed that strontium, europium, aluminum and silicon constituting the composition formula (2) contained in the starting compounds were also contained in the red phosphors with a substantially same molar ratio (atomic ratio). In addition, analysis of carbon contents (Z) in the respective red phosphors by using an ICP optical emission spectrometer and combustion in oxygen atmosphere-NDIR detection method revealed that the carbon contents (Z) were in the range of $0<z<1$.

This example reveals that the primary firing (1400° C., 2 h) of the two-step ordinary pressure firing can be omitted, thereby reducing process time. It was further revealed that a uniform composition can be obtained from one-step ordinary pressure firing by using #110 mesh pass, for example, after the mixing of precursor.

Figure 16:
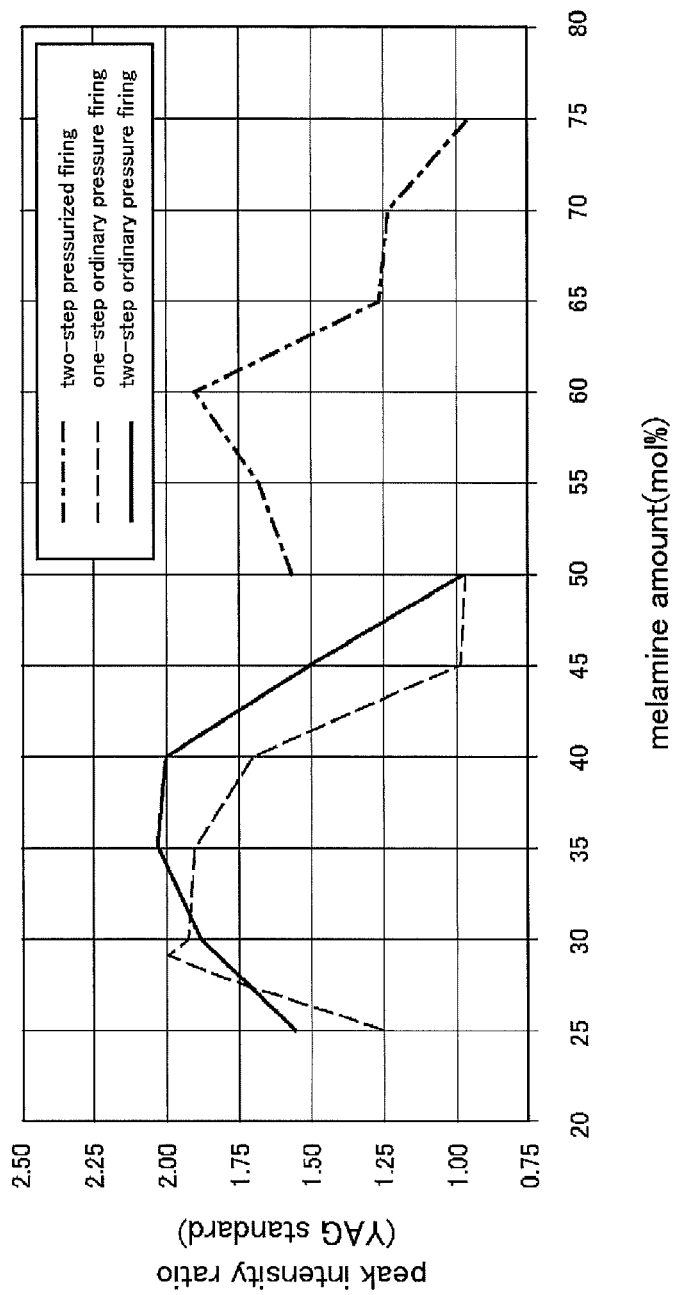
FIG. 16 is a graph showing peak intensity ratios (YAG standard) of respective red phosphors produced by two-step pressurized firing, two-step ordinary pressure firing and one-step ordinary pressure firing.
Figure 17:
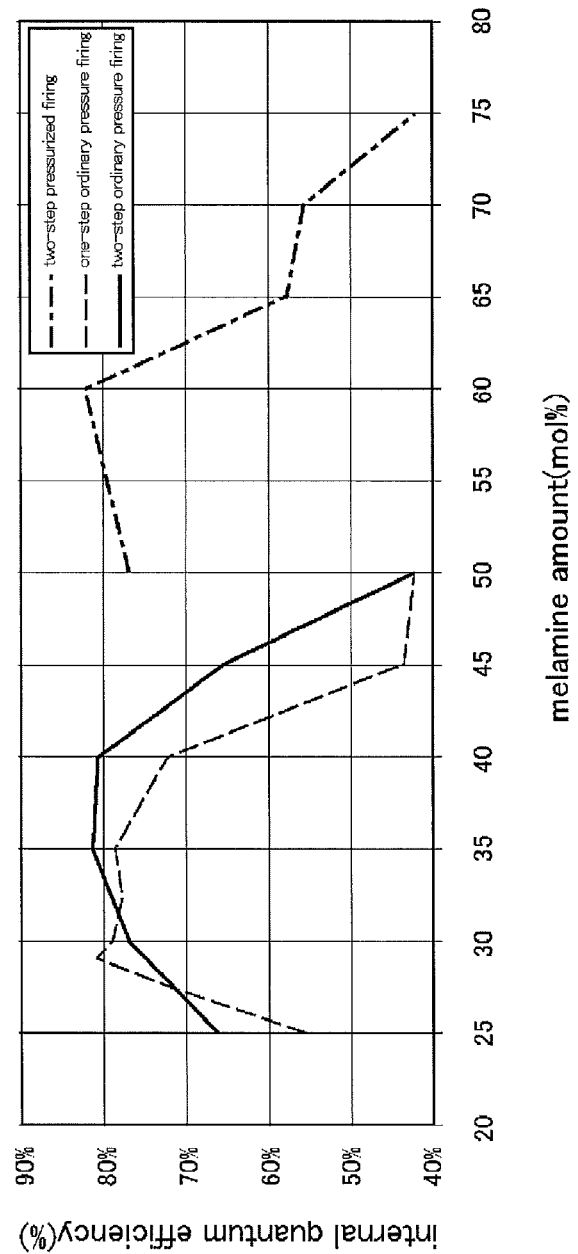
FIG. 17 is a graph showing internal quantum efficiencies of respective red phosphors produced by two-step pressurized firing, two-step ordinary pressure firing and one-step ordinary pressure firing.

FIGS. 16 and 17 are graphs respectively showing peak intensity ratios (YAG standard) and internal quantum efficiencies of respective red phosphors produced by two-step pressurized firing, two-step ordinary pressure firing and one-step ordinary pressure firing.

It was revealed that, optimal values of melamine amount were different among red phosphors respectively produced by two-step pressurized firing, two-step ordinary pressure firing and one-step ordinary pressure firing. In addition, maximum value of peak intensity ratio (YAG standard) of a red phosphor produced by two-step pressurized firing was 1.91, that of a red phosphor produced by two-step ordinary pressure firing was 2.03 and that of a red phosphor produced by one-step ordinary pressure firing was 1.99, which revealed that the red phosphor produced by ordinary pressure firing had a peak intensity larger than that of the red phosphor produced by pressurized firing. Furthermore, the red phosphor produced by two-step ordinary pressure firing and the red phosphor produced by one-step ordinary pressure firing had approximately same peak intensities. Furthermore, maximum internal quantum efficiency of a red phosphor produced by two-step pressurized firing was 82%, that of a red phosphor produced by two-step ordinary pressure firing was 81% and that of a red phosphor produced by one-step ordinary pressure firing was 81%, which revealed that the red phosphors would have approximately same internal quantum efficiencies regardless of whether they were produced by ordinary pressure firing or pressurized firing. It was further revealed that maximum peak intensity ratio and internal quantum efficiency could be obtained under a condition of ordinary pressure or low $H_2$ gas concentration atmosphere by setting melamine amount to 65% or less of the total mole number of strontium carbonate, nitrogen-free europium, silicon nitride and aluminum nitride.

<8.6 Effect of Firing Temperature on Light-Emitting Property>

Next, effect of firing temperature during the secondary firing was evaluated by using europium oxide ($Eu_2O_3$) as a source of europium. In this evaluation, red phosphors represented by composition formula (2) (m=3.79, x=0.0663 and y=0.474) were produced by the two-step ordinary pressure firings shown in FIG. 6 wherein $H_2$ gas concentrations of the precursor heat processing step and the primary firing step were set to be 75%, and firing temperatures of the secondary firing step were set to be 1500° C., 1600° C., 1700° C., 1750° C. and 1800° C.

Analysis of the respective red phosphors by using ICP optical emission spectrometer revealed that strontium, europium, aluminum and silicon constituting the composition formula (2) contained in the starting compounds were also contained in the red phosphors with a substantially same molar ratio (atomic ratio). In addition, analysis of carbon contents (Z) in the respective red phosphors by using an ICP optical emission spectrometer and combustion in oxygen atmosphere-NDIR detection method revealed that the carbon contents (Z) were in the range of $0<z<1$.

Figure 18:
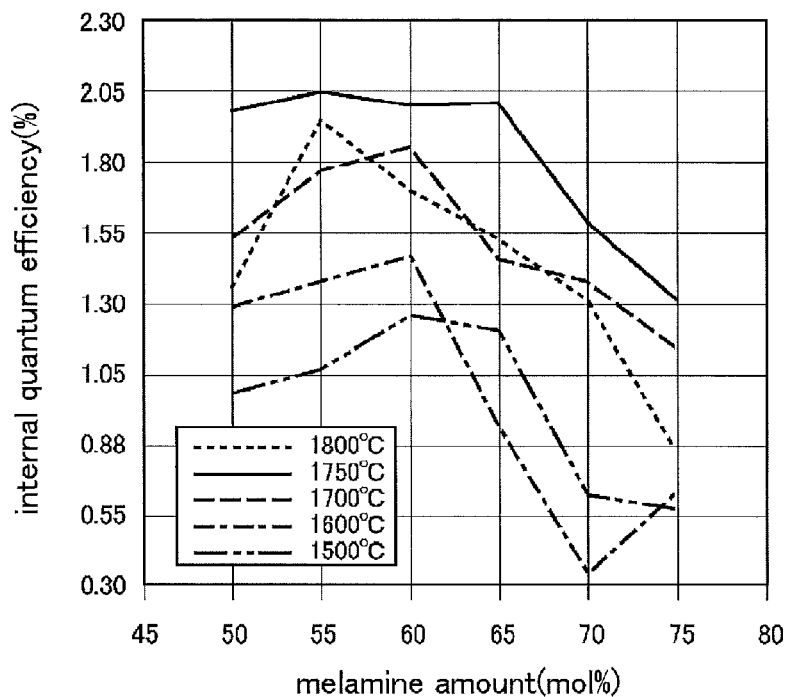
FIG. 18 is a graph showing peak intensity ratios (YAG standard) of respective red phosphors produced by firing at 1500° C., 1600° C., 1700° C., 1750° C. and 1800° C.

FIG. 18 is a graph showing peak intensity ratios (YAG standard) of respective red phosphors produced by firing at 1500° C., 1600° C., 1700° C., 1750° C. and 1800° C. It was revealed that changing the firing temperature of the secondary firing step would change the optimal value of melamine amount. It was further revealed that the peak intensity ratio (YAG standard) increased along with increase in the firing temperature.

Figure 19:
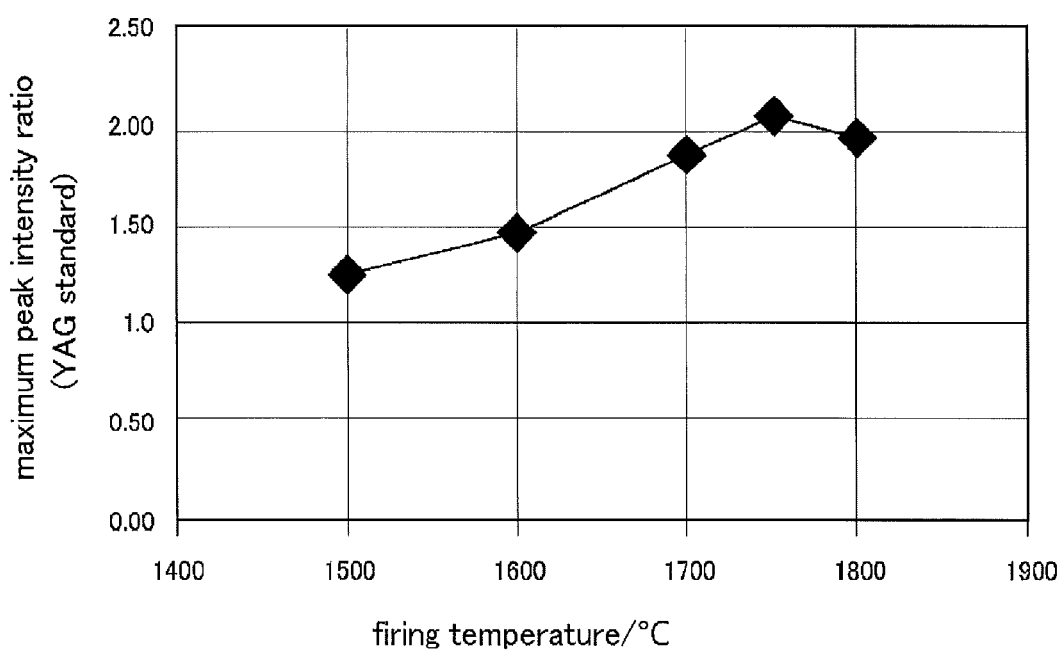
FIG. 19 is a graph showing maximum peak intensity ratios (YAG standard) of respective red phosphors produced by firing at 1500° C., 1600° C., 1700° C., 1750° C. and 1800° C.

FIG. 19 is a graph showing maximum peak intensity ratios (YAG standard) of respective red phosphors produced by firing at 1500° C., 1600° C., 1700° C., 1750° C. and 1800° C. Among these, secondary firing temperature of 1750° C. achieved the largest maximum peak intensity ratio under the above described two-step ordinary pressure condition.

<Manufacturing of a Red Phosphor with Another Composition>

Figure 20:
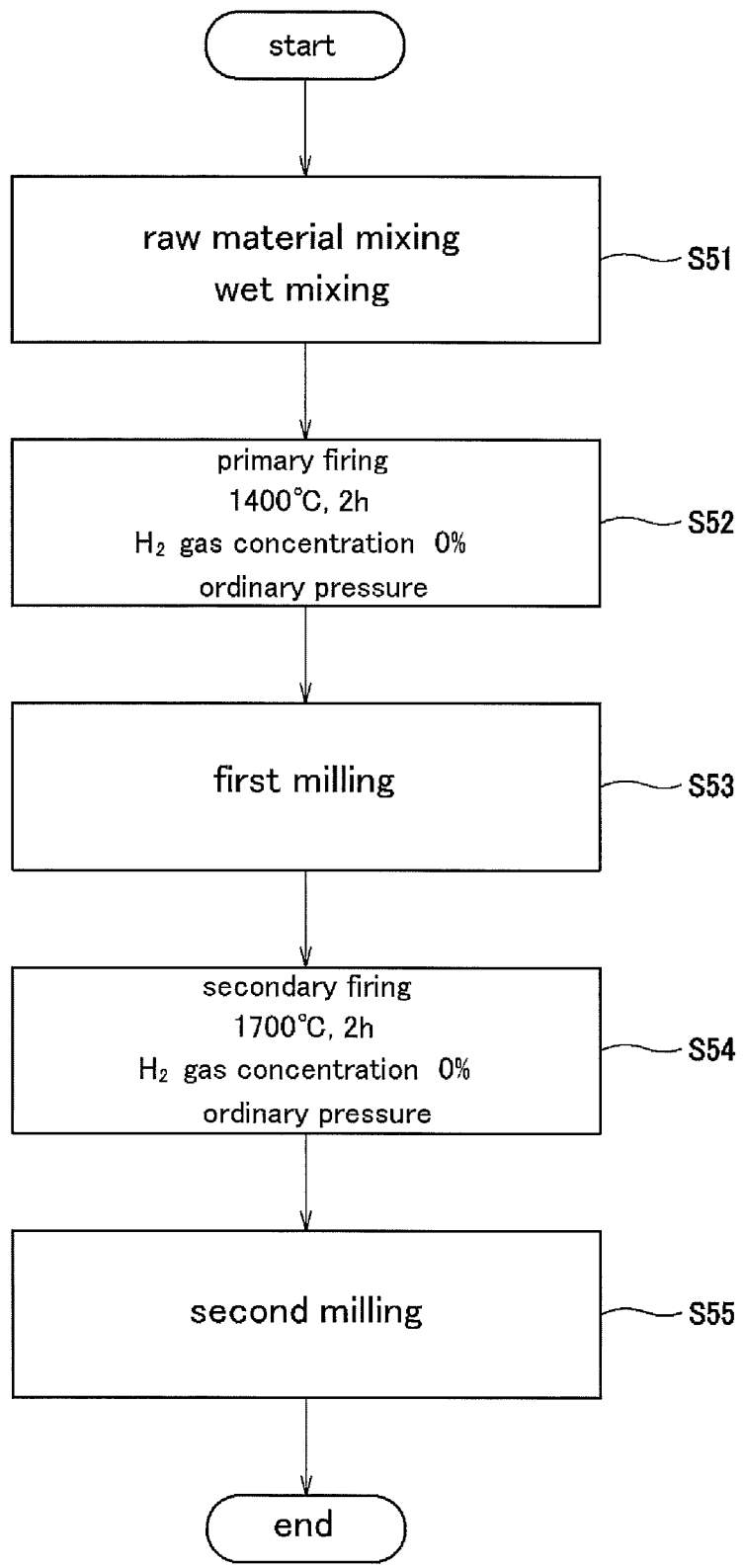
FIG. 20 is a flowchart showing an exemplary manufacturing method (two-step ordinary pressure firing in nitrogen atmosphere) of a red phosphor.

Next, a red phosphor with another composition was produced by the steps shown in the flowchart of FIG. 20. In this processes, europium oxide ($Eu_2O_3$) was used as a source of europium. Furthermore, melamine, which was used as a flux, was added at a predetermined ratio with respect to the total mole number of europium oxide, strontium carbonate, calcium carbonate, silicon nitride and aluminum nitride.

Raw material mixing step S51 was performed by employing a liquid-phase method (wet process), using ethanol as a solvent, stirring the respective starting compounds for 30 minutes, and filtering them under reduced pressure to separate precipitate. The precipitate was dried for eight hours at a temperature of 80° C. and then filtered by using #110 mesh to obtain a precursor mixture.

Primary firing step S52 was performed by weighing the mixture to a predetermined amount, filling the weighed mixture into a melting pot made of boron nitride (BN) and firing the mixture for two hours at a nitrogen gas concentration of 100% ($H_2$ gas concentration of 0%) and a heat process temperature of 1400° C.

First milling step S53 was performed by milling the fired product fired by the primary firing by using an agate mortar and then filtering it with a #100 mesh (having an aperture size of 200 µm) to obtain first powder.

Secondary firing step S54 was performed by firing the first powder within a melting pot made of boron nitride (BN) for two hours at an ordinary pressure, a nitrogen gas concentration of 100% ($H_2$ gas concentration of 0%) and a heat process temperature of 1700° C.

Second milling step S55 was performed by milling the secondary fired product by using an agate mortar and then filtering it with a #420 mesh (having an aperture size of 26 µm).

Red phosphors represented by composition formula (3) were obtained by above described two-step ordinary pressure firing in nitrogen atmosphere. Analysis of respective red phosphors by using an Inductively Coupled Plasma (ICP) optical emission spectrometer revealed that strontium, calcium, europium, aluminum and silicon constituting the composition formula (3) contained in the starting compounds were also contained in the red phosphors with a substantially same molar ratio (atomic ratio). In addition, analysis of carbon contents (Z) in the respective red phosphors by using an ICP optical emission spectrometer and combustion in oxygen atmosphere-NDIR detection method (device: EMIA-U511 (HORIBA, Ltd.)) revealed that the carbon contents (Z) were in the range of $0<z<1$.

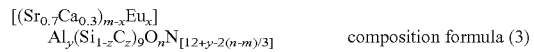

composition formula (3)

In this composition formula (3), the following formula will hold: m=3.79, x=0.142 and y=0.473.

Figure 21:
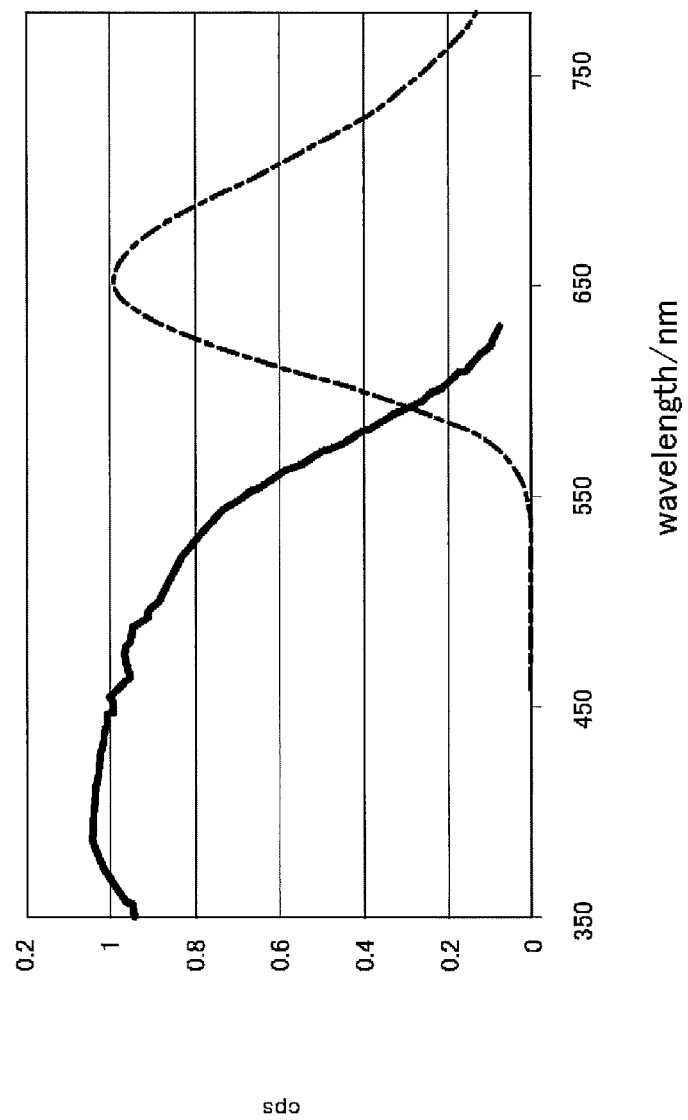
FIG. 21 shows emission/excitation spectrum of a red phosphor.

FIG. 21 shows emission/excitation spectrum of a red phosphor (melamine amount of 26 mol %) represented by the composition formula (3). The spectrum shown in FIG. 21 reveals that this red phosphor absorbs blue light and emits red light having an emission peak around 650 nm, which is suitable as a phosphor for white LED with blue LED excitation.

Figure 22:
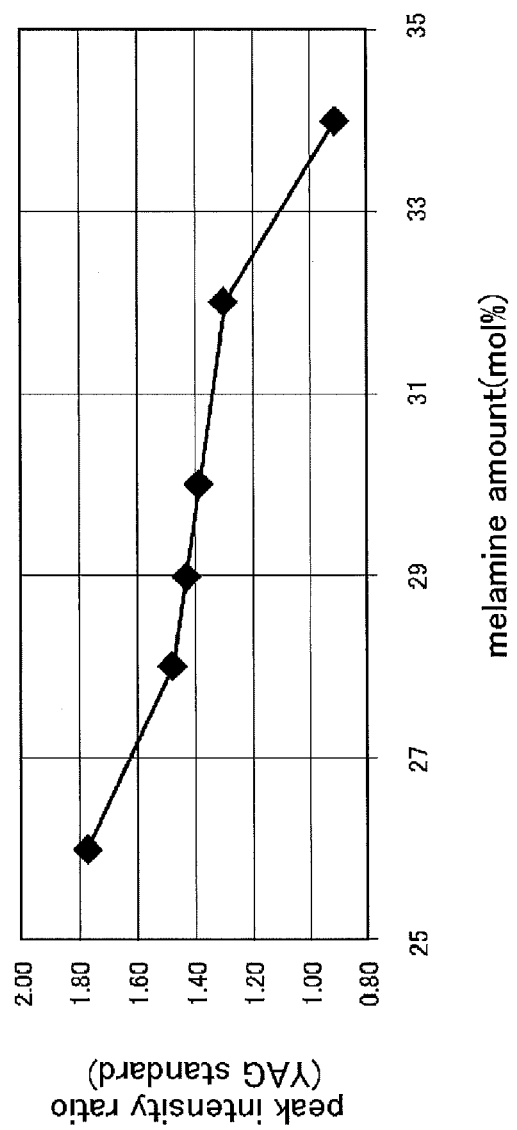
FIG. 22 is a graph showing peak intensity ratios (YAG standard) of respective red phosphors against melamine amounts.
Figure 23:
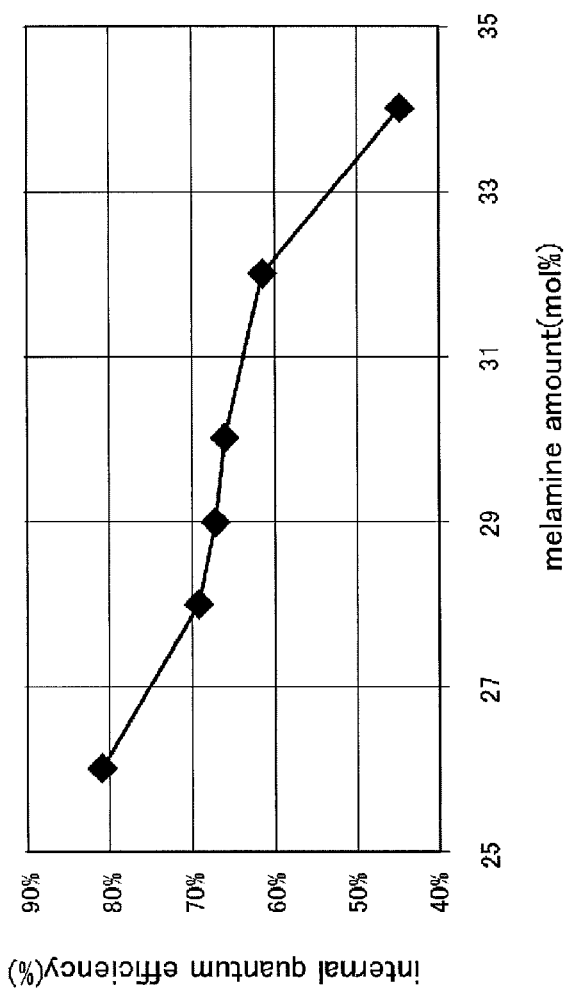
FIG. 23 is a graph showing internal quantum efficiencies of respective red phosphors against melamine amounts.

FIGS. 22 and 23 are graphs respectively showing peak intensity ratios (YAG standard) and internal quantum efficiencies of respective red phosphors against melamine amounts.

It was revealed that, in the case of manufacturing the red phosphor represented by composition formula (3) by using the above described two-step ordinary pressure firing in nitrogen atmosphere, lesser melamine amount would increase the peak intensity ratio (YAG standard) and internal quantum efficiency. The results shown in FIGS. 22 and 23 demonstrate maximum peak intensity ratio of 1.77 and maximum internal quantum efficiency of 80.9% at a melamine amount of 26 mol %.

<8.8 Relation Between Emission Intensity and X-Ray Diffraction Spectrum>

The inventors of the present invention found that an excellent emission intensity can be achieved when X-ray diffraction (XRD) spectrum of the above described red phosphor containing europium (Eu), silicon (Si), aluminum (Al), carbon (C), oxygen (O) and nitrogen (N) shows a specific diffraction pattern.

In particular, it was found that a high emission intensity can be achieved when the peak intensity existing at a position corresponding to a diffraction angle (2θ) of 36° to 36.6° caused by orthorhombic space group Pmn21 (112) plane (denoted as (112) plane hereinafter) has a sufficiently large value with comparison to the peak intensity existing at a position corresponding to a diffraction angle (2θ) of 35° to 36° caused by orthorhombic space group Pmn21 (113) plane (denoted as (113) plane hereinafter).

This relation between emission intensity and X-ray diffraction spectrum will be explained hereinafter with reference to sample 1 (Eu: 3.75 mol %, Al: 0 mol % and Ca: 0 mol %), sample 2 (Eu: 3.75 mol %, Al: 0 mol % and Ca: 20 mol %), sample 3 (Eu: 3.75 mol %, Al: 5 mol % and Ca: 0 mol %) and sample 4 (Eu: 3.75 mol %, Al: 10 mol % and Ca: 25 mol %), which were produced by conventional manufacturing method shown in FIG. 1.

In the following composition formula (4), the following formula will hold: α=0, m=3.6, x=0.135 and y=0 in sample 1, α=0.2, m=3.6, x=0.135 and y=0 in sample 2, α=0, m=3.79, x=0.142 and y=0.47 in sample 3, and α=0.25, m=4.0, x=0.15 and y=1.0 in sample 4.

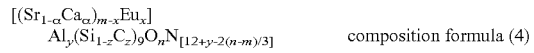

composition formula (4)

wherein z and n satisfy the relation: $0<z<1$ and $0<n<10$.

Emission spectra and X-ray diffraction spectra of these samples 1 to 4 with different melamine addition amounts were measured. The emission spectra were measured by using a fluorescence spectrophotometer FP-6500 produced by JASCO Corporation. In particular, the emission spectra were measured by filling phosphor powder into dedicated cell and illuminating blue excitation light with a wavelength of 450 nm. Subsequently, emission peak intensities were calculated based on the maximum peak heights of the emission spectra. The X-ray diffraction spectra were measured by using powder X-ray diffraction analyzer for X-ray of Cu-Kα (Rigaku Corporation).

Figure 24:
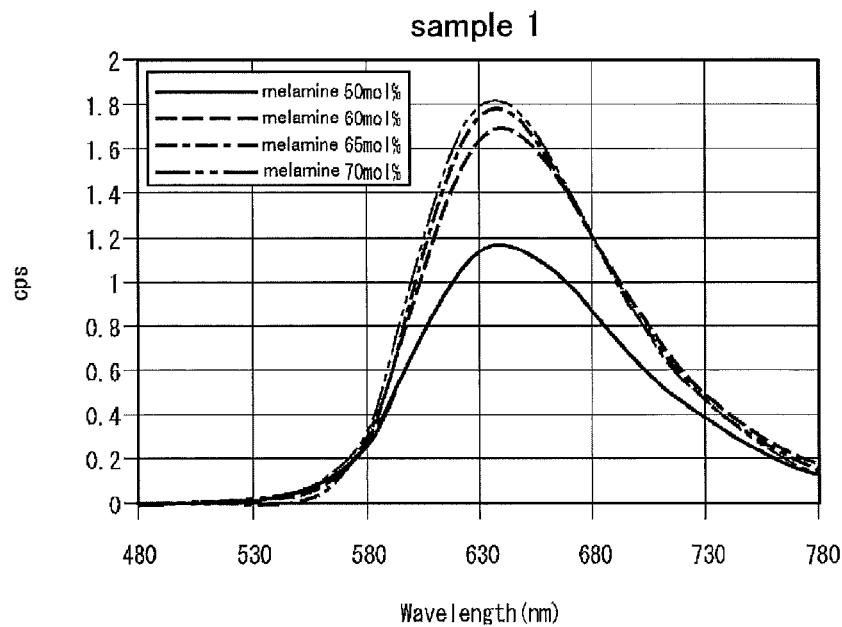
FIG. 24 shows emission spectra of respective red phosphors (sample 1) with different melamine addition amounts.

FIG. 24 shows emission spectra of respective red phosphors (sample 1) with different melamine addition amounts. As shown in FIG. 24, it was revealed that emission intensity increased and light-emission shifted toward shorter wavelength side as the melamine addition amount increased.

Figure 25:
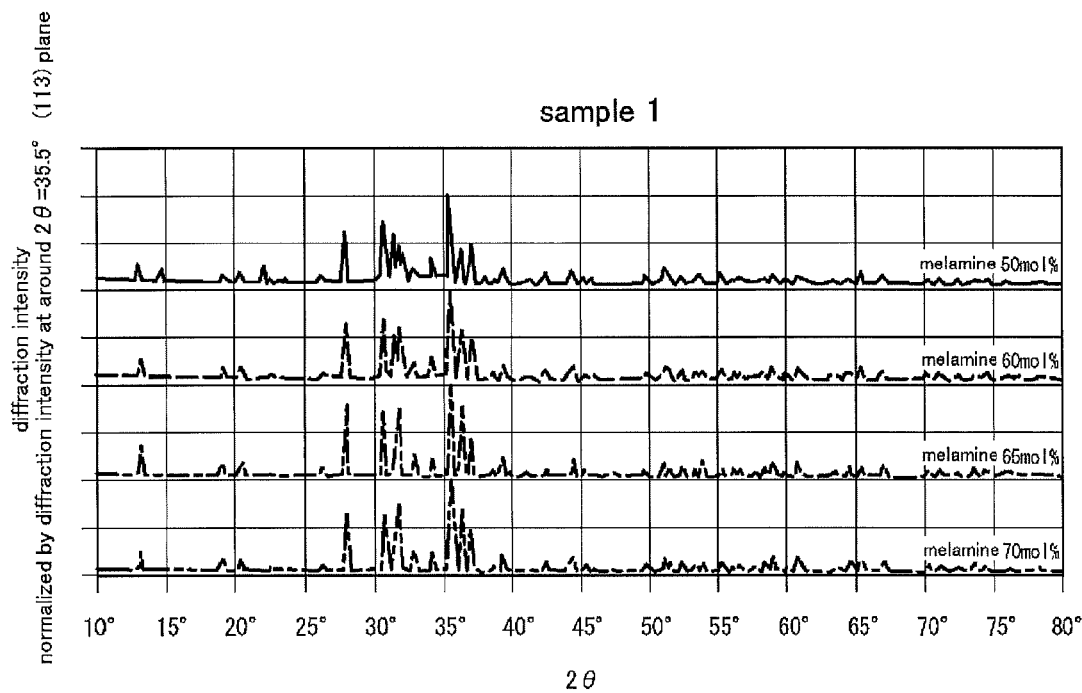
FIG. 25 shows XRD spectra of respective red phosphors (sample 1) with different melamine addition amounts normalized by the peak intensity existing at a position corresponding to a diffraction angle of 35° to 36°.
Figure 26:
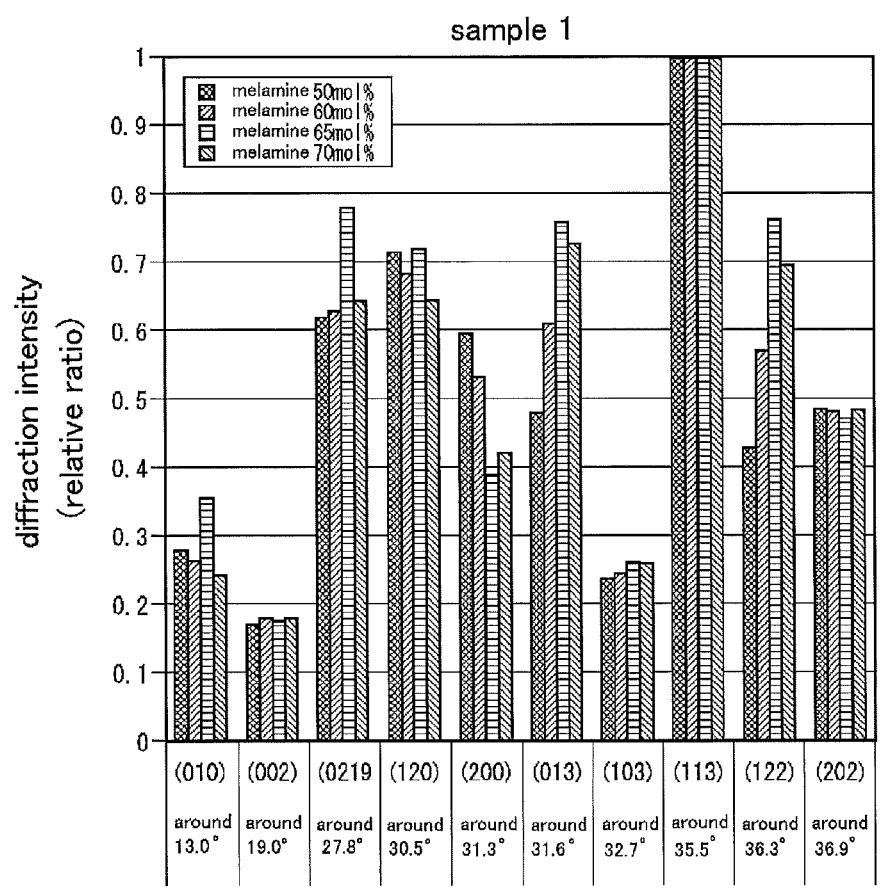
FIG. 26 is a graph showing diffraction peak intensity ratios of peak intensities of respective diffraction angles to the peak intensity existing at a position corresponding to a diffraction angle of 35.0° to 36.0° in XRD spectra of respective red phosphors (sample 1) with different melamine addition amounts.
Figure 27:
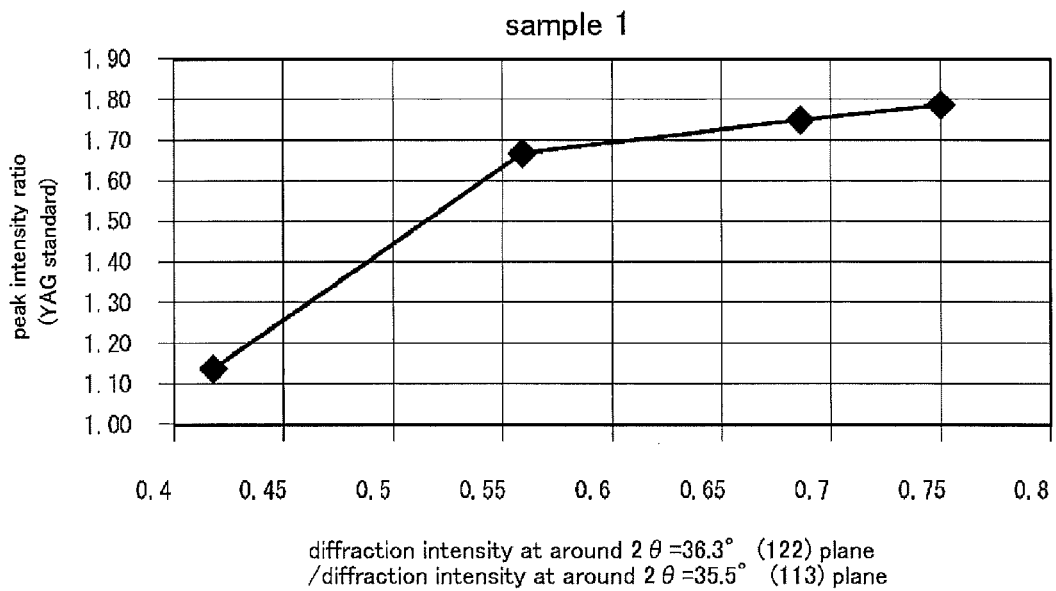
FIG. 27 shows a relation between a diffraction peak intensity ratio of the peak intensity existing at a position corresponding to a diffraction angle of 36.0° to 36.6° to the peak intensity existing at a position corresponding to a diffraction angle of 35.0° to 36.0° and an emission peak intensity ratio (YAG standard) in XRD spectra of respective red phosphors (sample 1) with different melamine addition amounts.

FIG. 25 shows XRD spectra of respective red phosphors (sample 1) with different melamine addition amounts normalized by the peak intensity existing at a position corresponding to a diffraction angle of 35° to 36°. FIG. 26 is a graph showing diffraction peak intensity ratios of peak intensities of respective diffraction angles to the peak intensity existing at a position corresponding to a diffraction angle of 35.0° to 36.0°. FIG. 27 shows a relation between a diffraction peak intensity ratio of the peak intensity existing at a position corresponding to a diffraction angle of 36.0° to 36.6° to the peak intensity existing at a position corresponding to a diffraction angle of 35.0° to 36.0° and an emission peak intensity ratio (YAG standard).

As shown in FIGS. 25 to 27, it was revealed in the red phosphors of sample 1 that the intensity ratio of the diffraction peak caused by (112) plane to the diffraction peak caused by (113) plane was proportional to the emission peak intensity ratios (YAG standard).

Figure 28:
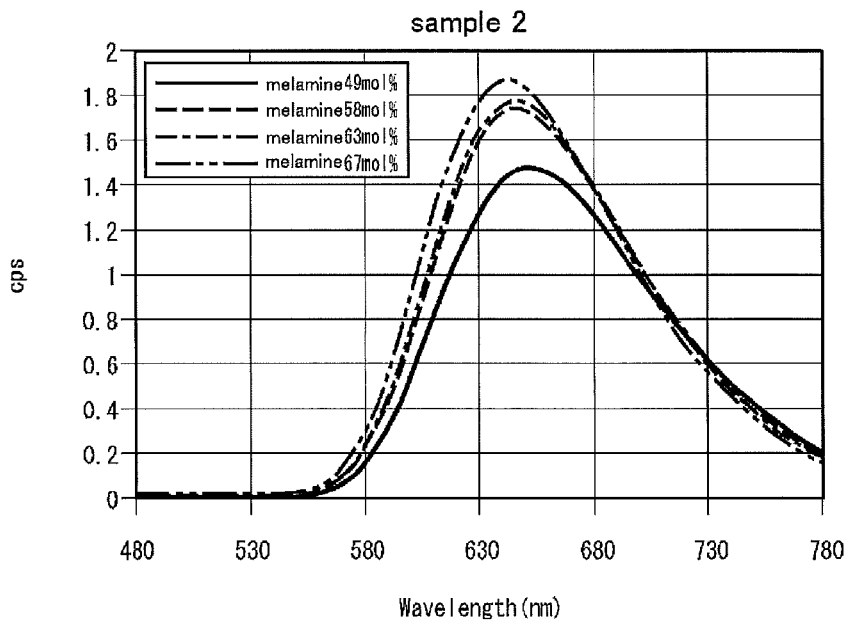
FIG. 28 shows emission spectra of respective red phosphors (sample 2) with different melamine addition amounts.

FIG. 28 shows emission spectra of respective red phosphors (sample 2) with different melamine addition amounts. As shown in FIG. 28, it was revealed that emission intensity increased and light-emission shifted toward shorter wavelength side as the melamine addition amount increased.

Figure 29:
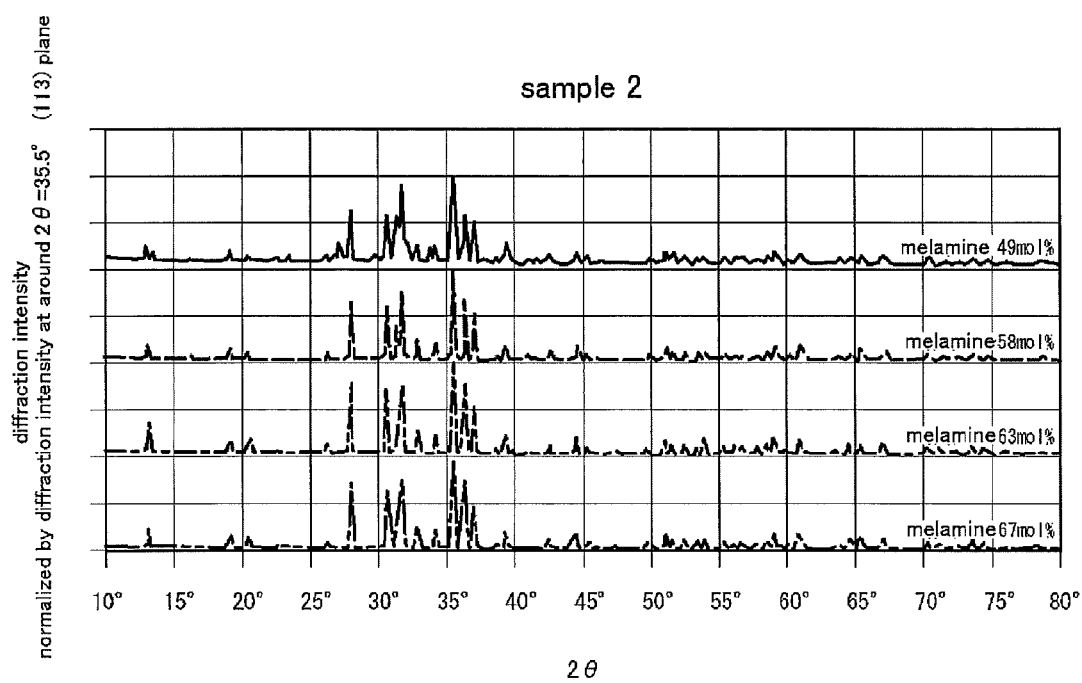
FIG. 29 shows XRD spectra of respective red phosphors (sample 2) with different melamine addition amounts normalized by the peak intensity existing at a position corresponding to a diffraction angle of 35° to 36°.
Figure 30:
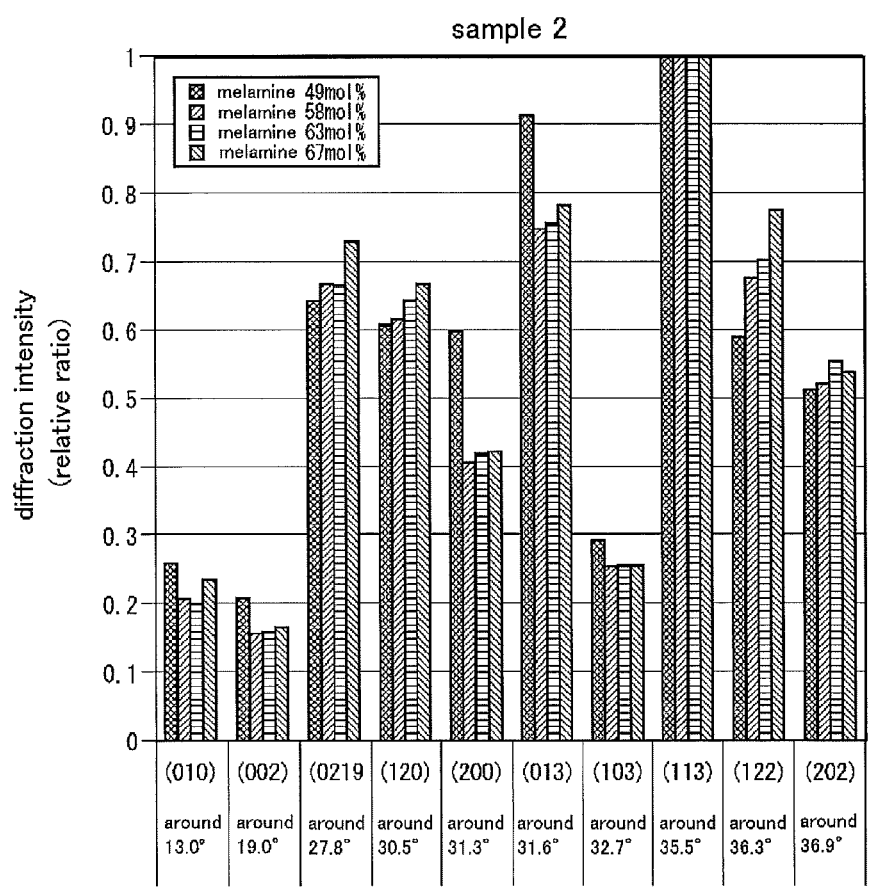
FIG. 30 is a graph showing diffraction peak intensity ratios of peak intensities of respective diffraction angles to the peak intensity existing at a position corresponding to a diffraction angle of 35.0° to 36.0° in XRD spectra of respective red phosphors (sample 2) with different melamine addition amounts.
Figure 31:
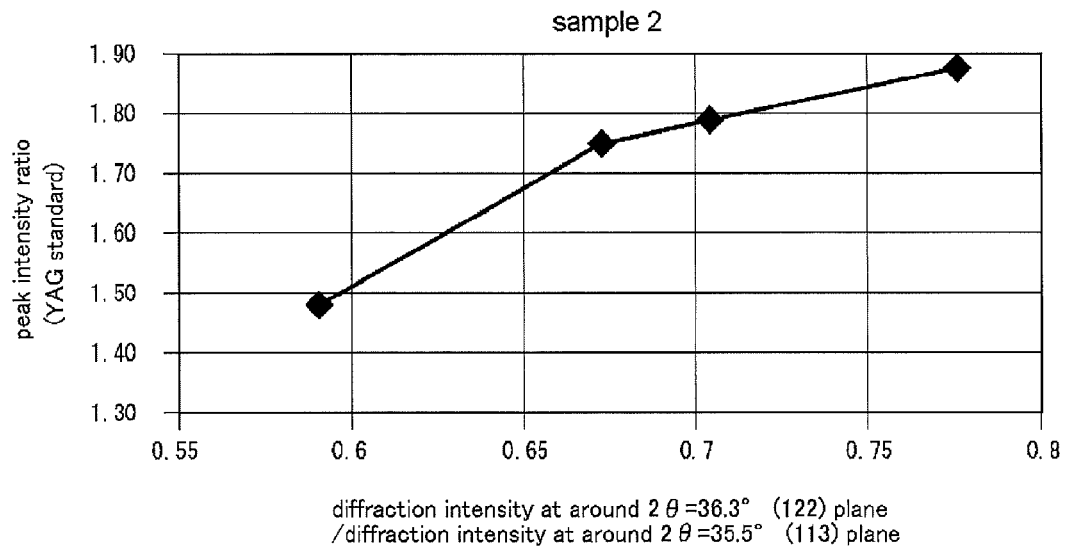
FIG. 31 shows a relation between a diffraction peak intensity ratio of the peak intensity existing at a position corresponding to a diffraction angle of 36.0° to 36.6° to the peak intensity existing at a position corresponding to a diffraction angle of 35.0° to 36.0° and an emission peak intensity ratio (YAG standard) in XRD spectra of respective red phosphors (sample 2) with different melamine addition amounts.

FIG. 29 shows XRD spectra of respective red phosphors (sample 2) with different melamine addition amounts normalized by the peak intensity existing at a position corresponding to a diffraction angle of 35° to 36°. FIG. 30 is a graph showing diffraction peak intensity ratios of peak intensities of respective diffraction angles to the peak intensity existing at a position corresponding to a diffraction angle of 35.0° to 36.0°. FIG. 31 shows a relation between a diffraction peak intensity ratio of the peak intensity existing at a position corresponding to a diffraction angle of 36.0° to 36.6° to the peak intensity existing at a position corresponding to a diffraction angle of 35.0° to 36.0° and an emission peak intensity ratio (YAG standard).

As shown in FIGS. 29 to 31, it was revealed in the red phosphors of sample 2 that the intensity ratio of the diffraction peak caused by (112) plane to the diffraction peak caused by (113) plane was proportional to the emission peak intensity ratios (YAG standard).

Figure 32:
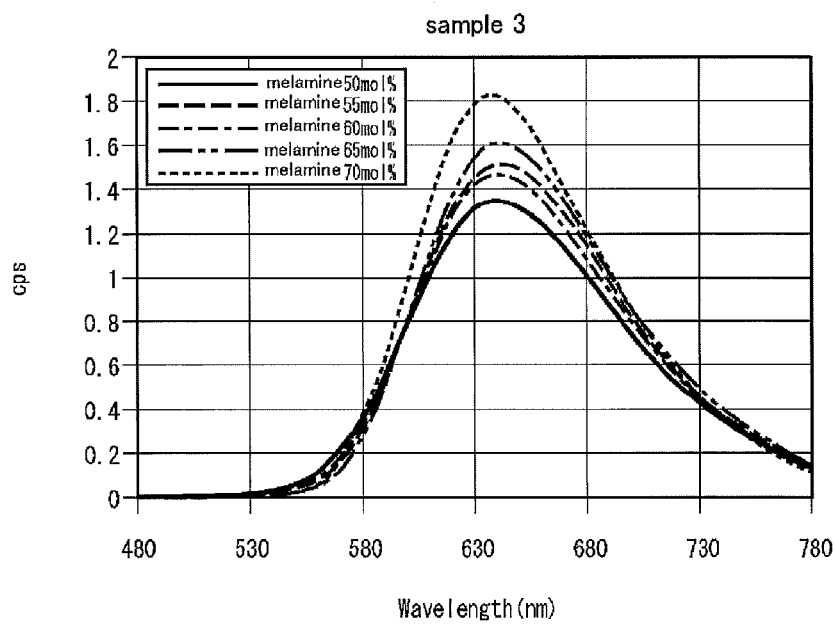
FIG. 32 shows emission spectra of respective red phosphors (sample 3) with different melamine addition amounts.

FIG. 32 shows emission spectra of respective red phosphors (sample 3) with different melamine addition amounts. As shown in FIG. 32, it was revealed that emission intensity increased and light-emission shifted toward shorter wavelength side as the melamine addition amount increased.

Figure 33:
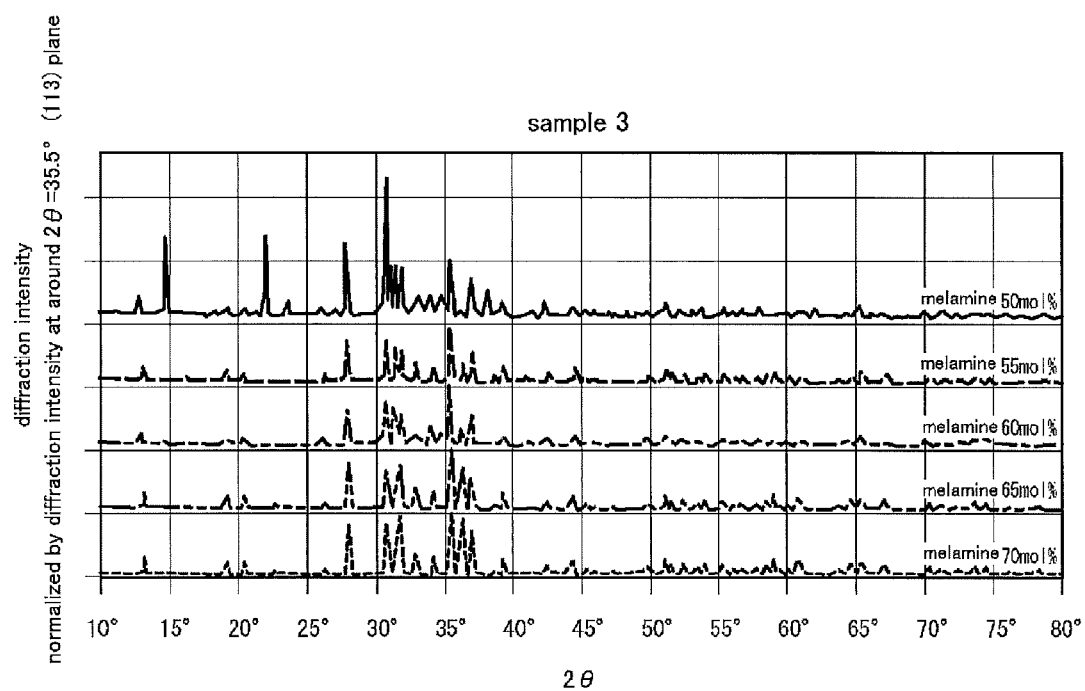
FIG. 33 shows XRD spectra of respective red phosphors (sample 3) with different melamine addition amounts normalized by the peak intensity existing at a position corresponding to a diffraction angle of 35° to 36°.
Figure 34:
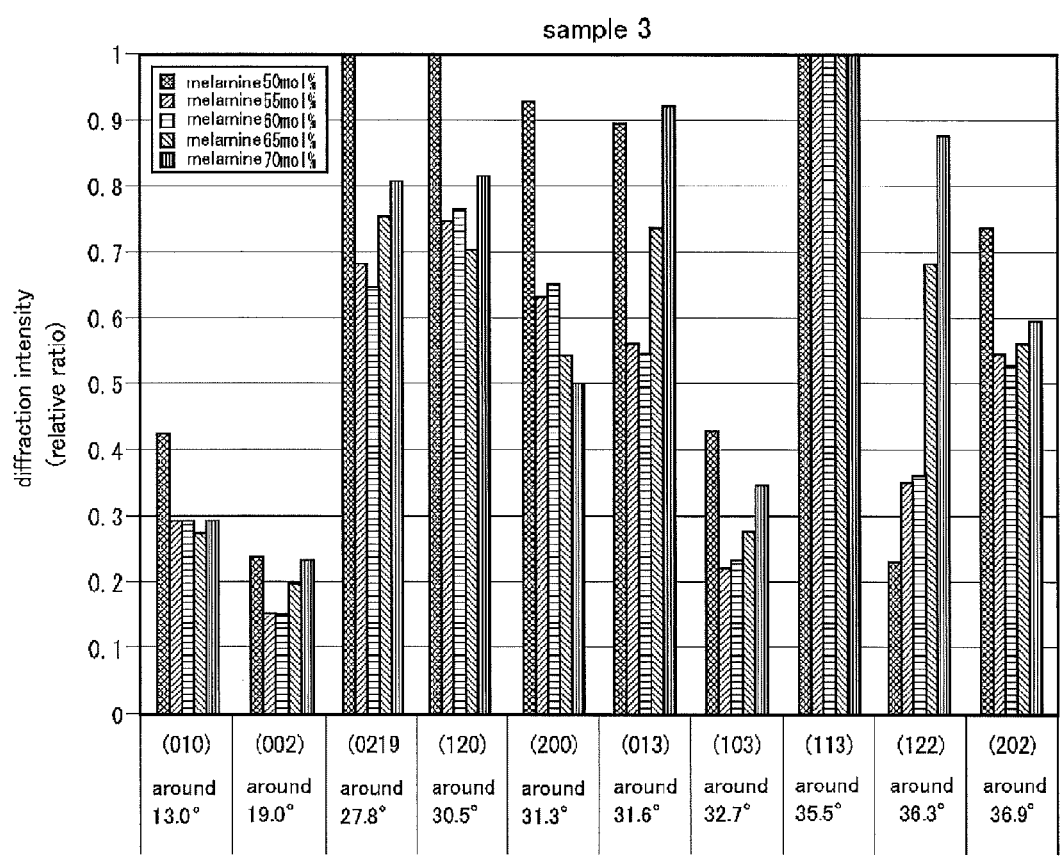
FIG. 34 is a graph showing diffraction peak intensity ratios of peak intensities of respective diffraction angles to the peak intensity existing at a position corresponding to a diffraction angle of 35.0° to 36.0° in XRD spectra of respective red phosphors (sample 3) with different melamine addition amounts.
Figure 35:
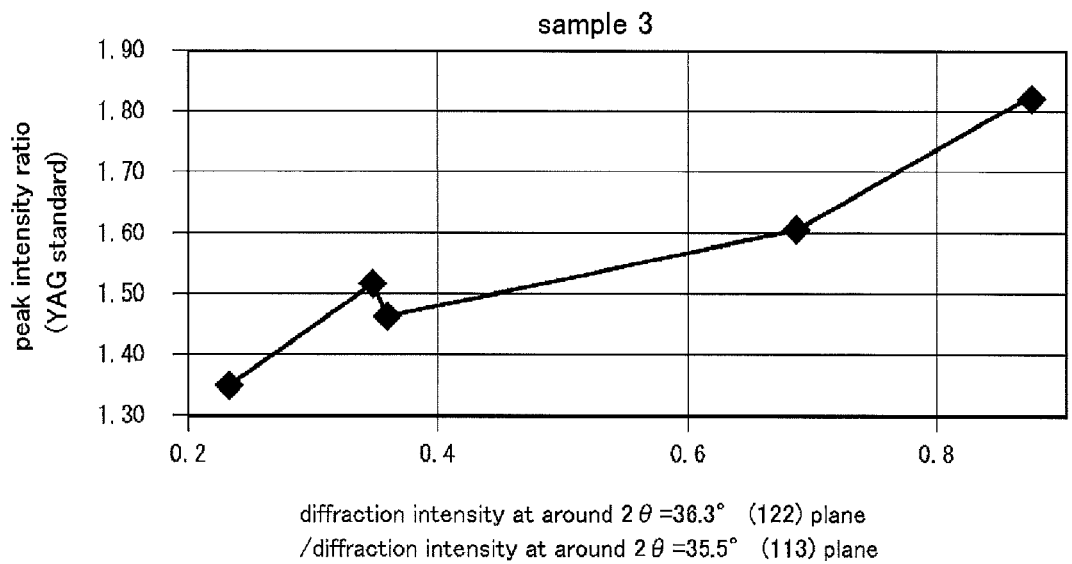
FIG. 35 shows a relation between a diffraction peak intensity ratio of the peak intensity existing at a position corresponding to a diffraction angle of 36.0° to 36.6° to the peak intensity existing at a position corresponding to a diffraction angle of 35.0° to 36.0° and an emission peak intensity ratio (YAG standard) in XRD spectra of respective red phosphors (sample 3) with different melamine addition amounts.

FIG. 33 shows XRD spectra of respective red phosphors (sample 3) with different melamine addition amounts normalized by the peak intensity existing at a position corresponding to a diffraction angle of 35° to 36°. FIG. 34 is a graph showing diffraction peak intensity ratios of peak intensities of respective diffraction angles to the peak intensity existing at a position corresponding to a diffraction angle of 35.0° to 36.0°. FIG. 35 shows a relation between a diffraction peak intensity ratio of the peak intensity existing at a position corresponding to a diffraction angle of 36.0° to 36.6° to the peak intensity existing at a position corresponding to a diffraction angle of 35.0° to 36.0° and emission peak intensity ratio (YAG standard).

As shown in FIGS. 33 to 35, it was revealed in the red phosphors of sample 3 that the intensity ratio of the diffraction peak caused by (112) plane to the diffraction peak caused by (113) plane was proportional to the emission peak intensity ratios (YAG standard).

Figure 36:
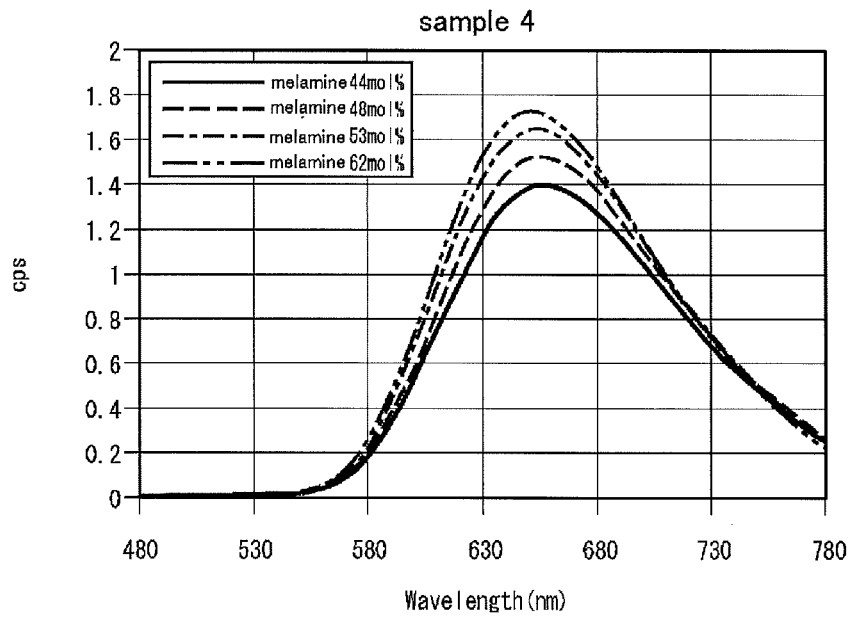
FIG. 36 shows emission spectra of respective red phosphors (sample 4) with different melamine addition amounts.

FIG. 36 shows emission spectra of respective red phosphors (sample 4) with different melamine addition amounts. As shown in FIG. 36, it was revealed that emission intensity increased and light-emission shifted toward shorter wavelength side as the melamine addition amount increased.

Figure 37:
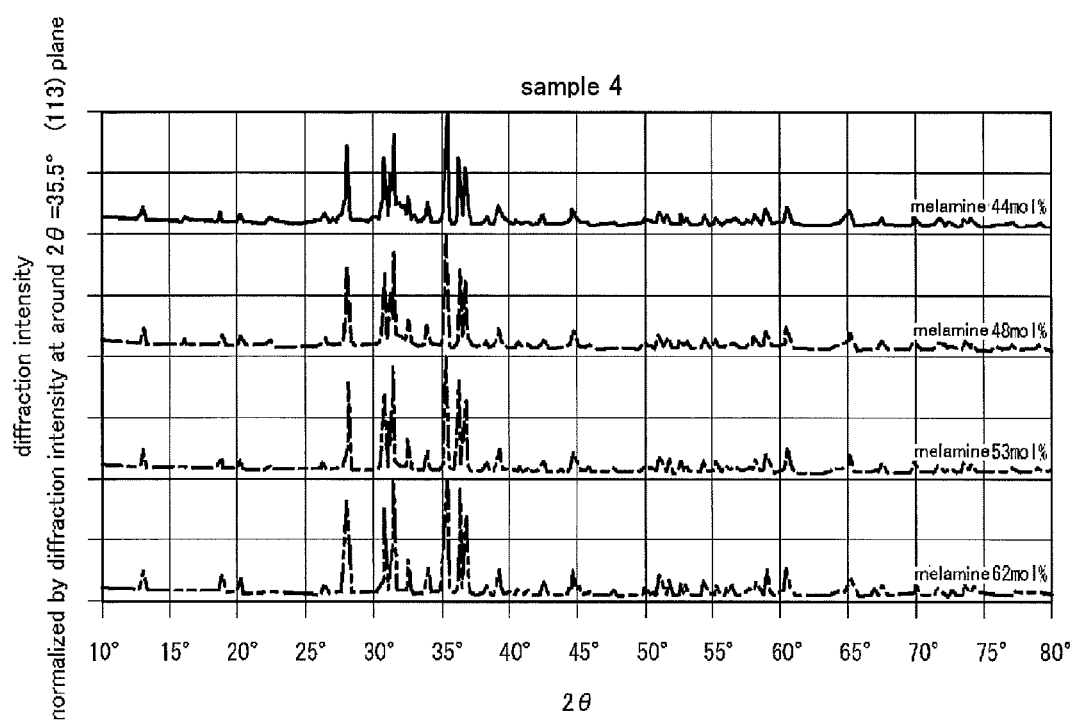
FIG. 37 shows XRD spectra of respective red phosphors (sample 4) with different melamine addition amounts normalized by the peak intensity existing at a position corresponding to a diffraction angle of 35° to 36°.
Figure 38:
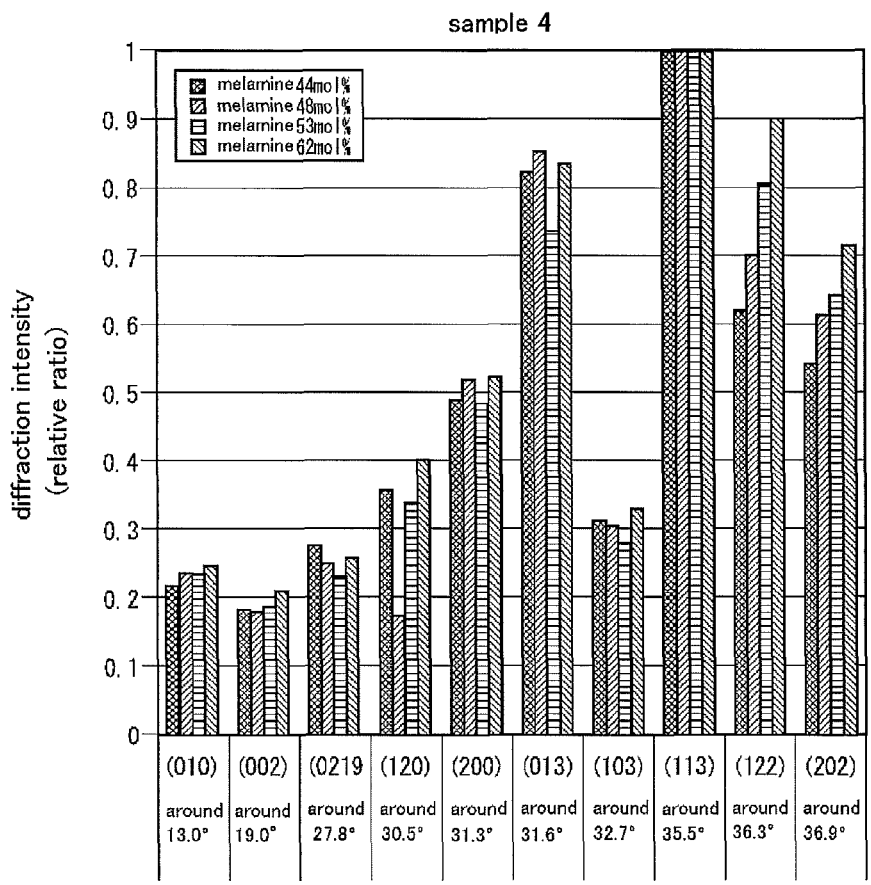
FIG. 38 is a graph showing diffraction peak intensity ratios of peak intensities of respective diffraction angles to the peak intensity existing at a position corresponding to a diffraction angle of 35.0° to 36.0° in XRD spectra of respective red phosphors (sample 4) with different melamine addition amounts.
Figure 39:
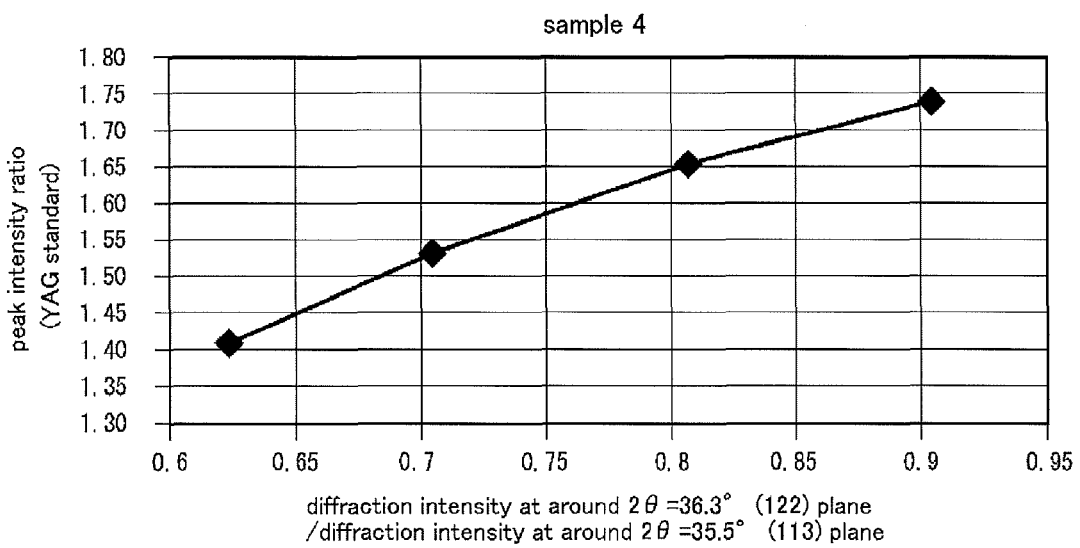
FIG. 39 shows a relation between a diffraction peak intensity ratio of the peak intensity existing at a position corresponding to a diffraction angle of 36.0° to 36.6° to the peak intensity existing at a position corresponding to a diffraction angle of 35.0° to 36.0° and an emission peak intensity ratio (YAG standard) in XRD spectra of respective red phosphors (sample 4) with different melamine addition amounts.

FIG. 37 shows XRD spectra of respective red phosphors (sample 4) with different melamine addition amounts normalized by the peak intensity existing at a position corresponding to a diffraction angle of 35° to 36°. FIG. 38 is a graph showing diffraction peak intensity ratios of peak intensities of respective diffraction angles to the peak intensity existing at a position corresponding to a diffraction angle of 35.0° to 36.0°. FIG. 39 shows a relation between a diffraction peak intensity ratio of the peak intensity existing at a position corresponding to a diffraction angle of 36.0° to 36.6° to the peak intensity existing at a position corresponding to a diffraction angle of 35.0° to 36.0° and an emission peak intensity ratio (YAG standard).

As shown in FIGS. 37 to 39, it was revealed in the red phosphors of sample 4 that the intensity ratio of the diffraction peak caused by (112) plane to the diffraction peak caused by (113) plane was proportional to the emission peak intensity ratios (YAG standard).

Consequently, it was revealed from the red phosphors of samples 1 to 4 that the intensity ratio of the diffraction peak caused by (112) plane to the diffraction peak caused by (113) plane was proportional to the emission peak intensity ratios (YAG standard) regardless of the presence or absence of Al or Ca.

Especially, it was revealed that a red phosphor with a crystal structure having an intensity ratio of the diffraction peak caused by (112) plane to the diffraction peak caused by (113) plane equal to or more than 0.65 could achieve an emission peak intensity ratio (YAG standard) equal to or more than 1.5.

<8.9 Red Phosphor Manufactured by Present Method>

Next, red phosphors manufactured by the present method were compared to red phosphors having the same composition manufactured by a conventional method. A red phosphor of example 1 was manufactured by two-step ordinary pressure firings using wet mixing as shown in the flowchart of FIG. 6 by using europium oxide ($Eu_2O_3$) as a source of europium. Charge amount of melamine was 29 mol %. On the other hand, a red phosphor of example 2 was manufactured by one-step ordinary pressure firing using wet mixing as shown in the flowchart of FIG. 15 by using europium oxide ($Eu_2O_3$) as a source of europium. Charge amount of melamine was 29 mol %.

In addition, a conventional red phosphor was manufactured by the conventional method shown in FIG. 1 by using europium nitride (EuN) as a source of europium. That is, raw material mixing step S101 was performed by using dry mixing, primary firing step S102 was performed under $H_2$ gas concentration of 75%, and secondary firing step S104 was performed under a pressurized condition of 0.85 MPa. Charge amount of melamine was 30 mol %, and charge amounts of the other raw materials, Sr, Eu, Al and Si, were selected to be the same composition of the red phosphor of the present method.

Regarding to these red phosphors, element measurements of Sr, Eu, Al and Si were performed with ICP optical emission spectrometer, element measurement of N was performed with impulse heating and melting TCD method, element measurement of 0 was performed with impulse heating and melting ND-IR method and element measurement of C was performed with combustion in oxygen atmosphere ND-IR method. As a result, these red phosphors held following formula in composition formula (2): m=3.79, x=0.0663 and y=0.474. In addition, carbon content of the red phosphor of example 1 was 0.032 wt %, or 0.023 when scaled to the value of z in composition formula (2), and carbon content of the red phosphor of example 2 was 0.1 wt %, or 0.072 when scaled to the value of z in composition formula (2). On the other hand, carbon content of the red phosphor manufactured by the conventional method was 0.038 wt %, or 0.027 when scaled to the value of z in composition formula (2).

Figure 40:
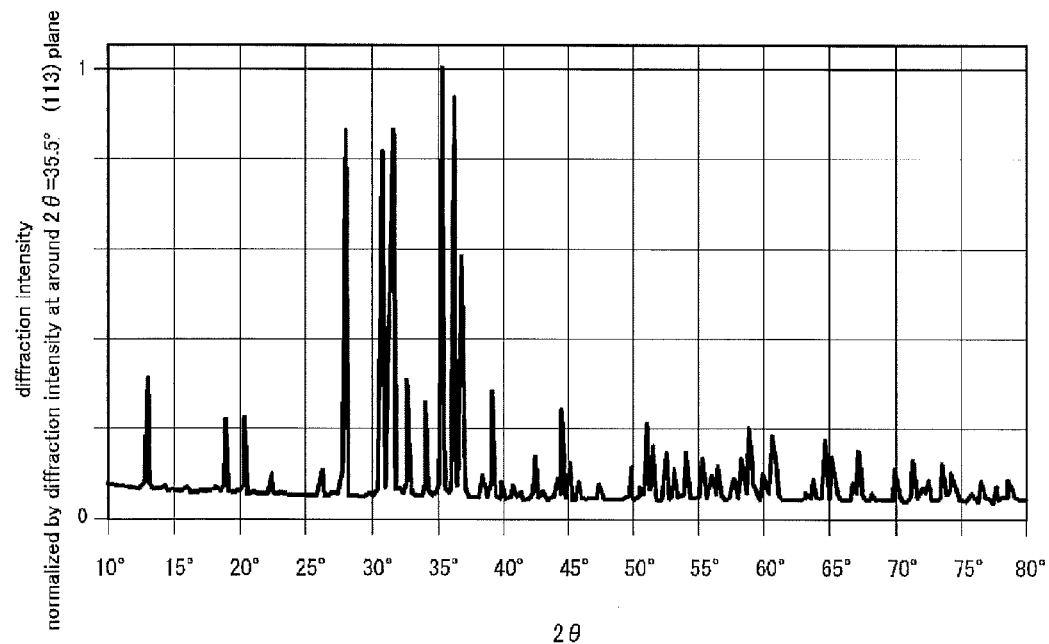
FIG. 40 shows XRD spectra of the red phosphor of example 1 normalized by the peak intensity existing at a position corresponding to a diffraction angle of 35° to 36°.

FIG. 40 shows XRD spectra of the red phosphor of example 1 normalized by the peak intensity existing at a position corresponding to a diffraction angle of 35° to 36°. The red phosphor of example 1 had an intensity ratio of the diffraction peak caused by (112) plane to the diffraction peak caused by (113) plane of 0.93. In addition, the emission peak intensity ratio (YAG standard) of the red phosphor of example 1 was 1.99.

On the other hand, the red phosphor of example 2 had an intensity ratio of the diffraction peak caused by (112) plane to the diffraction peak caused by (113) plane of 1.00. In addition, the emission peak intensity ratio (YAG standard) of the red phosphor of example 2 was 1.74.

Figure 41:
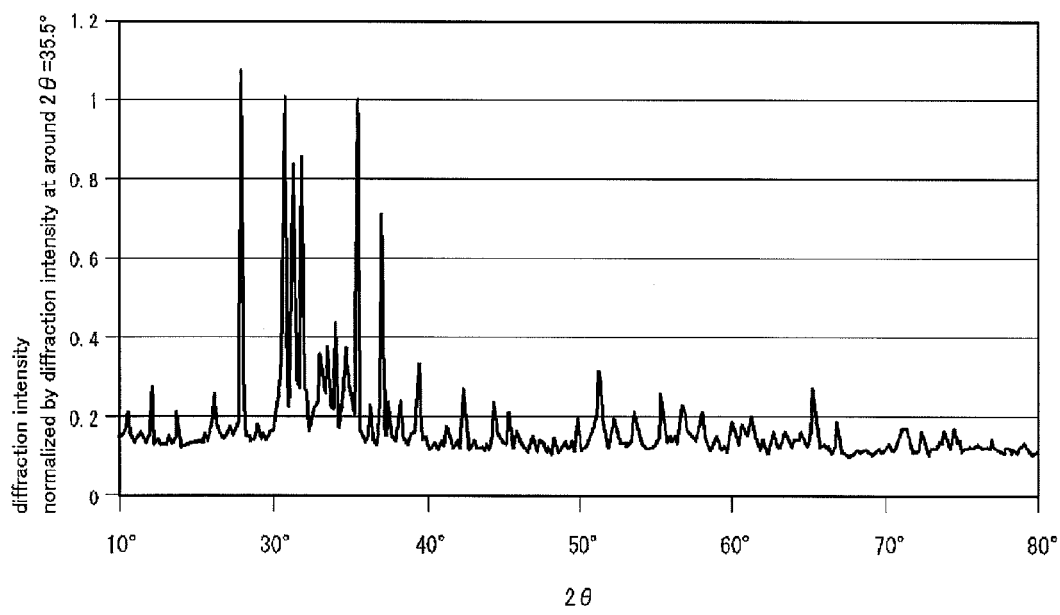
FIG. 41 shows XRD spectra of the red phosphor manufactured by the conventional method normalized by the peak intensity existing at a position corresponding to a diffraction angle of 35° to 36°.

FIG. 41 shows XRD spectra of the red phosphor manufactured by the conventional method normalized by the peak intensity existing at a position corresponding to a diffraction angle of 35° to 36°. The red phosphor manufactured by conventional method had an intensity ratio of the diffraction peak caused by (112) plane to the diffraction peak caused by (113) plane of 0.23. In addition, the emission peak intensity ratio (YAG standard) of the red phosphor manufactured by conventional method was 0.82.

These results prove that an excellent light-emission can be obtained by the present method even in a red phosphor having a small amount of carbon contents (a small value of z). In particular, a crystal structure having an intensity ratio of the diffraction peak caused by (112) plane to the diffraction peak caused by (113) plane equal to or more than 0.65 in orthorhombic space group Pmn21 can be obtained even if the carbon content (z) is 0.072 or less.

In contrast, conventional method cannot produce a crystal structure having an intensity ratio of the diffraction peak caused by (112) plane to the diffraction peak caused by (113) plane equal to or more than 0.65 in orthorhombic space group Pmn21 when the carbon content (z) is 0.072 or less.

Consequently, the crystal structure of the red phosphor produced by the present method differs from that of the red phosphor produced by the conventional method in that the intensity ratio of the diffraction peak caused by (112) plane to the diffraction peak caused by (113) plane is equal to or more than 0.65 in orthorhombic space group Pmn21 even if the carbon content (z) is 0.072 or less.

<8.10 Light-Emitting Property of Photoluminescence Excitation (PLE) Spectrum>

Figure 42:
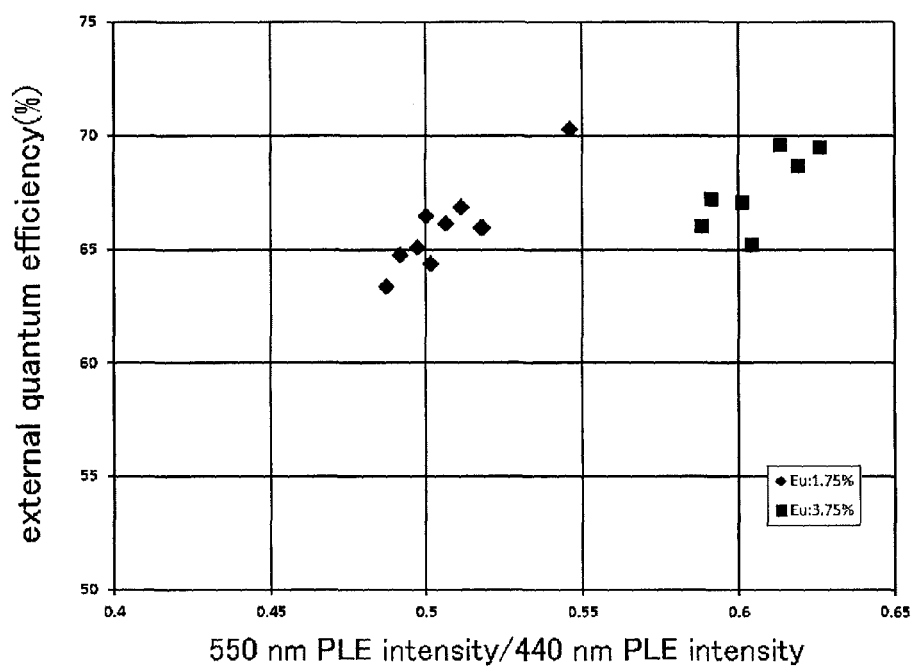
FIG. 42 is a graph, with regard to red phosphors, showing relations between emission intensities at an excitation wavelength of 550 nm relative to the value of an emission intensity at an excitation wavelength of 400 nm set equal to 1 and external quantum efficiencies.

FIG. 42 is a graph showing, with regard to respective red phosphors with different melamine addition amounts, relations between emission intensities at an excitation wavelength of 550 nm relative to the value of an emission intensity at an excitation wavelength of 400 nm set equal to 1 (denoted as 550 nm PLE intensity/440 nm PLE intensity hereinafter) and external quantum efficiencies. The 550 nm PLE intensity/440 nm PLE intensity is a relative value of the emission intensity at the excitation wavelength of 550 nm to the value of the emission intensity at the excitation wavelength of 400 nm set equal to 1 in PLE spectra of respective red phosphors. The external quantum efficiencies of the respective red phosphors were measured by using the fluorescence spectrophotometer FP-6500 produced by JASCO Corporation. In particular, fluorescence spectra were measured by filling phosphor powder into dedicated cell and illuminating blue excitation light with a wavelength of 450 nm, and then the external quantum efficiencies of red phosphors were calculated from the resulting fluorescence spectra by using a quantum efficiency measuring software appended to the fluorescence spectrophotometer.

The red phosphors of samples A and B were manufactured by two-step ordinary pressure firings using wet mixing as shown in the flowchart of FIG. 6 by using europium oxide ($Eu_2O_3$) as a source of europium. In the above mentioned composition formula (4), sample A (Eu: 1.75 mol %, Al: 5 mol % and Ca: 0 mol %) held the following formula: $\alpha=0$, m=3.79, x=0.0663 and y=0.4736. On the other hand, sample B (Eu: 3.75 mol %, Al: 5 mol % and Ca: 30 mol %) held the following formula: $\alpha=0.3$, m=3.79, x=0.142 and y=0.4736.

Melamine addition amounts were in a range of 22 to 50 mol % to the total mole number of calcium carbonate, europium oxide, silicon nitride and aluminum nitride.

The graph shown in FIG. 42 reveals that a high external quantum efficiency can be obtained by 550 nm PLE intensity/440 nm PLE intensity of 0.48 or more.

Comparison between sample A and sample B in FIG. 42 demonstrates that plotted points shift in parallel when the Eu concentrations are changed from 1.75% to 3.75%. These results reveals that changing the Eu concentration (x) of the composition formula (2) in a range of $0.05 \leq x \leq 0.15$ will improve external quantum efficiency of a red phosphor.

As explained hereinabove, the red phosphor according to an embodiment of the present invention has an X-ray diffraction pattern in which a peak intensity existing at a position corresponding to a diffraction angle of 36° to 36.6° is 0.65 times or more than a peak intensity existing at a position corresponding to a diffraction angle of 35° to 36°, thereby showing an excellent light-emitting property. This red phosphor shows an excellent light-emitting property even if the carbon content (Z) in the red phosphor shown in the composition formula (1) is 0.072 or less. In the case that the carbon content (Z) in the red phosphor is low, the amount of melamine for using as raw material can be reduced, thereby suppressing the amount of raw material to be used and improving cost performance.

Furthermore, the manufacturing method according to an embodiment of the present invention can reduce charge amount of melamine, thereby reducing the cost related to the use of melamine. Moreover, reduction of the charge amount of melamine can prevent adverse effect such as clogging of ducts of a device with melamine, thereby eliminating the necessity of providing a filter at a downstream portion of a device and reducing running cost.

REFERENCE SIGNS LIST 1 white light source, 5 illumination apparatus, 21 blue light-emitting diode, 43 kneaded material, 100 liquid crystal display device, 110 liquid crystal display panel, 120 back light (illumination apparatus 5)

The invention claimed is:

1. A method for manufacturing a red phosphor comprising steps of:
   mixing an element A-containing compound, a nitrogen-free europium, a silicon-containing compound, an aluminum-containing compound and a carbon-containing reducing agent so as to form a mixture, the atomic ratio among element A, europium (Eu), silicon (Si), aluminum(Al) and carbon (C) being a value represented by composition formula (1);
   firing the mixture; and milling the fired mixture;

$$(A_{m-x}Eu_x)Al_y(Si_{1-z}C_z)_9O_nN_{[12+y-2(n-m)/3]} \quad \text{composition formula (1)}$$

wherein the element A is at least one element selected from the group of magnesium (Mg), calcium (Ca), strontium (Sr) and barium (Ba), and m, x, z and n satisfy the relation: $3<m<5$, $0<x<1$, $0\leq y<2$, $0<z<1$, and $0<n<10$.

2. The method for manufacturing a red phosphor according to claim 1, wherein
   the nitrogen-free europium is at least one of europium oxide, europium acetate and europium carbonate, and
   the mixture is formed by mixing a carbonate compound of the element A, the nitrogen-free europium, silicon nitride, aluminum nitride and the carbon-containing reducing agent.

3. The method for manufacturing a red phosphor according to claim 2, wherein
   the mixture is produced by a wet process.

4. The method for manufacturing a red phosphor according to claim 3, wherein
   the carbon-containing reducing agent is a melamine, and
   the addition amount of the melamine is equal to or less than 65% of the total mole number of the carbonate compound of the element A, nitrogen-free europium, silicon nitride and aluminum nitride.

5. The method for manufacturing a red phosphor according to claim 4, wherein
   the firing is performed under an ordinary pressure.

6. The method for manufacturing a red phosphor according to claim 5, wherein
   the firing is performed in an atmosphere having $H_2$ gas concentration of 4% or less.

7. The method for manufacturing a red phosphor according to claim 6, wherein
   the firing is performed at a temperature range of 1400° C. to 1800° C.

* * * * *